US012787176B2

(12) United States Patent
Uejima et al.

(10) Patent No.: US 12,787,176 B2
(45) Date of Patent: Nov. 3, 2026

(54) HIGH-FREQUENCY MODULE INCLUDING AN ELECTRONIC COMPONENT DISPOSED ON A MOUNTING BOARD, WHERE THE ELECTRONIC COMPONENT DIRECTLY CONTACTS A GROUND ELECTRODE

(71) Applicant: Murata Manufacturing Co., Ltd., Kyoto (JP)

(72) Inventors: Takanori Uejima, Kyoto (JP); Hiromichi Kitajima, Kyoto (JP); Dai Nakagawa, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 409 days.

(21) Appl. No.: 18/493,069

(22) Filed: Oct. 24, 2023

(65) Prior Publication Data

US 2024/0057247 A1 Feb. 15, 2024

Related U.S. Application Data

(63) Continuation of application No. PCT/JP2022/017828, filed on Apr. 14, 2022.

(30) Foreign Application Priority Data

Apr. 26, 2021 (JP) ................................ 2021-074438

(51) Int. Cl.

| | |
|---|---|
| ***H05K 1/181*** | (2026.01) |
| ***H05K 1/02*** | (2006.01) |
| ***H05K 3/28*** | (2006.01) |

(52) U.S. Cl.

CPC ........... *H05K 1/181* (2013.01); *H05K 1/0203* (2013.01); *H05K 1/0206* (2013.01); (Continued)

(58) Field of Classification Search

CPC ............................ H05K 1/181; H05K 1/0203

See application file for complete search history.

(56) References Cited

U.S. PATENT DOCUMENTS

| | | | | |
|---|---|---|---|---|
| 10,404,226 | B2 * | 9/2019 | Kitahara et al. .......... | H03F 3/21 |
| 10,561,012 | B2 | 2/2020 | Chen | |

(Continued)

FOREIGN PATENT DOCUMENTS

| | | |
|---|---|---|
| JP | 2013-026330 A | 2/2013 |
| JP | 2018-098677 A | 6/2018 |

(Continued)

OTHER PUBLICATIONS

International Search Report for PCT/JP2022/017828 dated Jul. 5, 2022.

*Primary Examiner* — Benny T Lee

(74) *Attorney, Agent, or Firm* — McDonald Hopkins LLC

(57) ABSTRACT

A high-frequency module includes a mounting board, a first electronic component, a first resin layer, and a first ground electrode. The mounting board has a first principal surface and a second principal surface facing each other. The first electronic component is disposed on the first principal surface of the mounting board. The first resin layer is disposed on the first principal surface of the mounting board, and covers at least a part of an outer peripheral surface of the first electronic component. The first ground electrode covers at least a part of the first resin layer. A principal surface of the first electronic component opposite to the mounting board is connected to the first ground electrode. The mounting board includes a second ground electrode inside the mounting board. The first ground electrode is connected to the second ground electrode.

19 Claims, 16 Drawing Sheets

(52) U.S. Cl.
CPC ............. *H05K 1/0219* (2013.01); *H05K 3/28* (2013.01); *H05K 2201/10053* (2013.01); *H05K 2201/1006* (2013.01); *H05K 2201/10098* (2013.01)

(56) References Cited

U.S. PATENT DOCUMENTS

| | | | |
|---|---|---|---|
| 2013/0020119 | A1 | 1/2013 | Yoshida |
| 2015/0008789 | A1 | 1/2015 | Iwamoto |
| 2018/0166387 | A1 | 6/2018 | Matsui et al. |
| 2019/0140615 | A1 | 5/2019 | Fujiya et al. |
| 2019/0230781 | A1 | 7/2019 | Onodera |
| 2019/0274237 | A1 | 9/2019 | Otsubo |
| 2020/0203288 | A1 | 6/2020 | Otsubo et al. |
| 2021/0099191 | A1 | 4/2021 | Uejima |
| 2021/0233865 | A1 | 7/2021 | Tarui et al. |

FOREIGN PATENT DOCUMENTS

| | | | |
|---|---|---|---|
| WO | 2013/146374 | A1 | 10/2013 |
| WO | 2014/013831 | A1 | 1/2014 |
| WO | 2018/003819 | A1 | 1/2018 |
| WO | 2018/092529 | A1 | 5/2018 |
| WO | 2018/101381 | A1 | 6/2018 |
| WO | 2019/045088 | A1 | 3/2019 |
| WO | 2019/244816 | A1 | 12/2019 |
| WO | 2020/054004 | A1 | 3/2020 |

* cited by examiner

HIGH-FREQUENCY MODULE INCLUDING AN ELECTRONIC COMPONENT DISPOSED ON A MOUNTING BOARD, WHERE THE ELECTRONIC COMPONENT DIRECTLY CONTACTS A GROUND ELECTRODE

CROSS REFERENCE TO RELATED APPLICATION

This is a continuation of International Application No. PCT/JP2022/017828 filed on Apr. 14, 2022 which claims priority from Japanese Patent Application No. 2021-074438 filed on Apr. 26, 2021. The contents of these applications are incorporated herein by reference in their entireties.

BACKGROUND OF THE DISCLOSURE

Field of the Disclosure

The present disclosure relates generally to a high-frequency module and a communication device, and more specifically, to a high-frequency module including an electronic component disposed on a mounting board, and a communication device including the high-frequency module.

Description of the Related Art

A module (high-frequency module) described in Patent Document 1 includes a module board (mounting board), a filter (first electronic component), a resin layer (first resin layer), and a metal film. The filter is disposed on the module board. The resin layer is provided so as to cover the lateral surfaces of the filter. The metal film is provided on the upper surfaces of the filter and the resin layer. The heat generated by the filter is dissipated via the metal layer.

Patent Document 1: International Publication No. 2014/013831 (published Jan. 23, 2014)

BRIEF SUMMARY OF THE DISCLOSURE

In the module described in Patent Document 1, the heat dissipation performance for the filter (first electronic component) is insufficient.

The present disclosure has been made in view of the above problem, and has a possible benefit to provide a high-frequency module and a communication device in which the heat dissipation performance for a first electronic component can be improved.

A high-frequency module according to one aspect of the present disclosure includes a mounting board, a first electronic component, a first resin layer, and a first ground electrode. The mounting board has a first principal surface and a second principal surface facing each other. The first electronic component is disposed on the first principal surface of the mounting board. The first resin layer is disposed on the first principal surface of the mounting board, and covers at least a part of an outer peripheral surface of the first electronic component. The first ground electrode covers at least a part of the first resin layer. A principal surface of the first electronic component opposite to the mounting board is connected to the first ground electrode. The mounting board includes a second ground electrode inside the mounting board. The first ground electrode is connected to the second ground electrode.

A communication device according to one aspect of the present disclosure includes the high-frequency module and a signal processing circuit. The signal processing circuit processes a high-frequency signal that passes through the high-frequency module.

The present disclosure attains an advantage in that the heat dissipation performance for the first electronic component can be improved.

DETAILED DESCRIPTION OF THE DISCLOSURE

FIG. 1 to FIG. 16 to be referenced in the following embodiment and the like are schematic diagrams. In the figures, the ratios of the sizes and thicknesses of constituent elements do not necessarily reflect actual dimensional ratios.

Embodiment

(1) Overview

Figure 3:
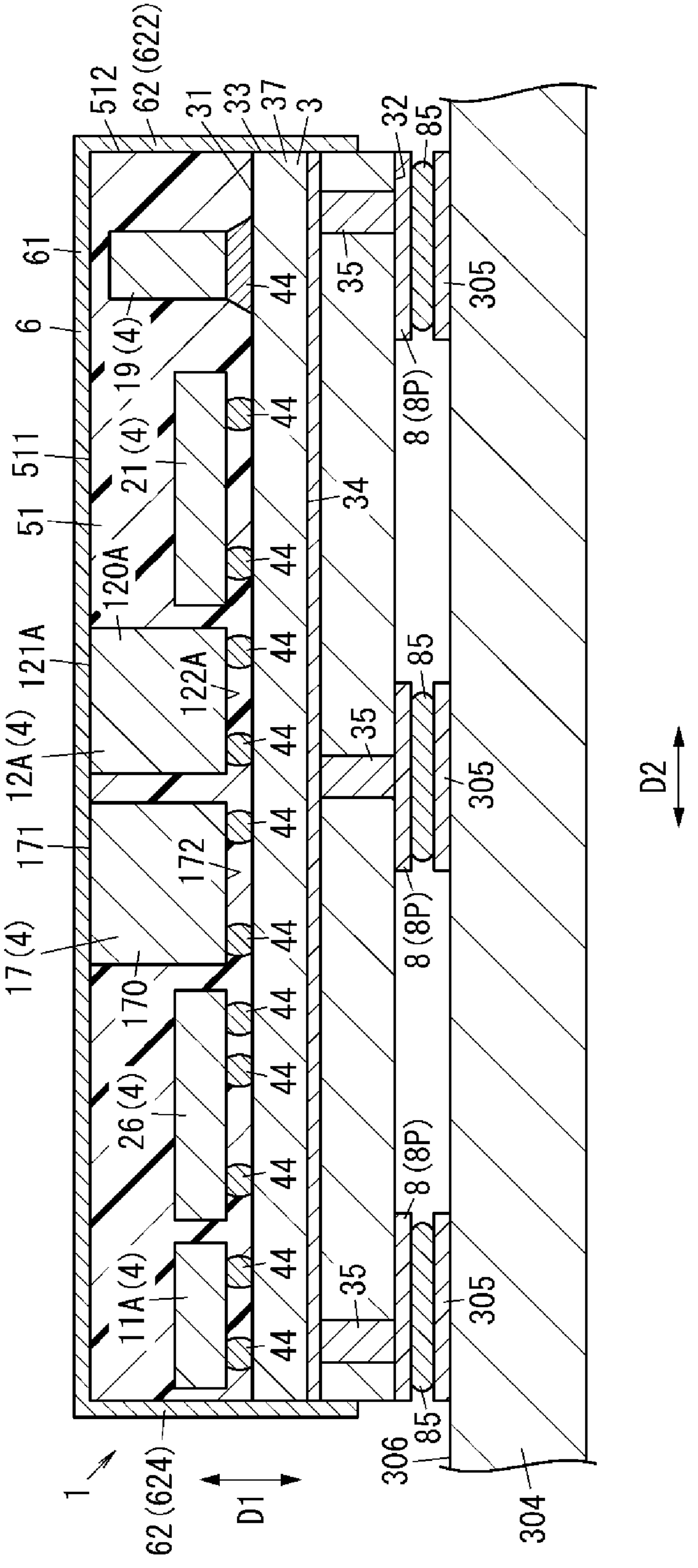
FIG. 3 is a cross-sectional view taken along the line X1-X1 in FIG. 2.

As illustrated in FIG. 3, a high-frequency module 1 according to this embodiment includes a mounting board 3, first electronic components (for example, a transmission filter 12A and a transmission/reception filter 17), a first resin layer 51, and a first ground electrode 6. The mounting board 3 has a first principal surface 31 and a second principal surface 32 facing each other. The first electronic components 12A and 17 are disposed on the first principal surface 31 of the mounting board 3. The first resin layer 51 is disposed on the first principal surface 31 of the mounting board 3, and covers at least a part of the outer peripheral surfaces of the first electronic components 12A and 17. The first ground electrode 6 covers at least a part of the first resin layer 51. Principal surfaces 121A and 171 of the first electronic components 12A and 17 opposite to the mounting board 3 are connected to the first ground electrode 6. The mounting board 3 includes a second ground electrode 34 inside the mounting board 3. The first ground electrode 6 is connected to the second ground electrode 34.

In this structure, the principal surfaces 121A and 171 of the first electronic components 12A and 17 opposite to the mounting board 3 are connected to the first ground electrode 6, and the first ground electrode 6 is connected to the second ground electrode 34. Thus, the heat generated by the first electronic components 12A and 17 can be dissipated to the second ground electrode 34 through the first ground electrode 6. As a result, the heat dissipation performance for the first electronic components 12A and 17 can be improved.

(2) Detailed Description

The high-frequency module 1 and a communication device 300 (e.g., in FIG. 1) according to this embodiment are described below in detail with reference to FIG. 1 to FIG. 6.

(2-1) Configuration of Communication Device

Figure 1:
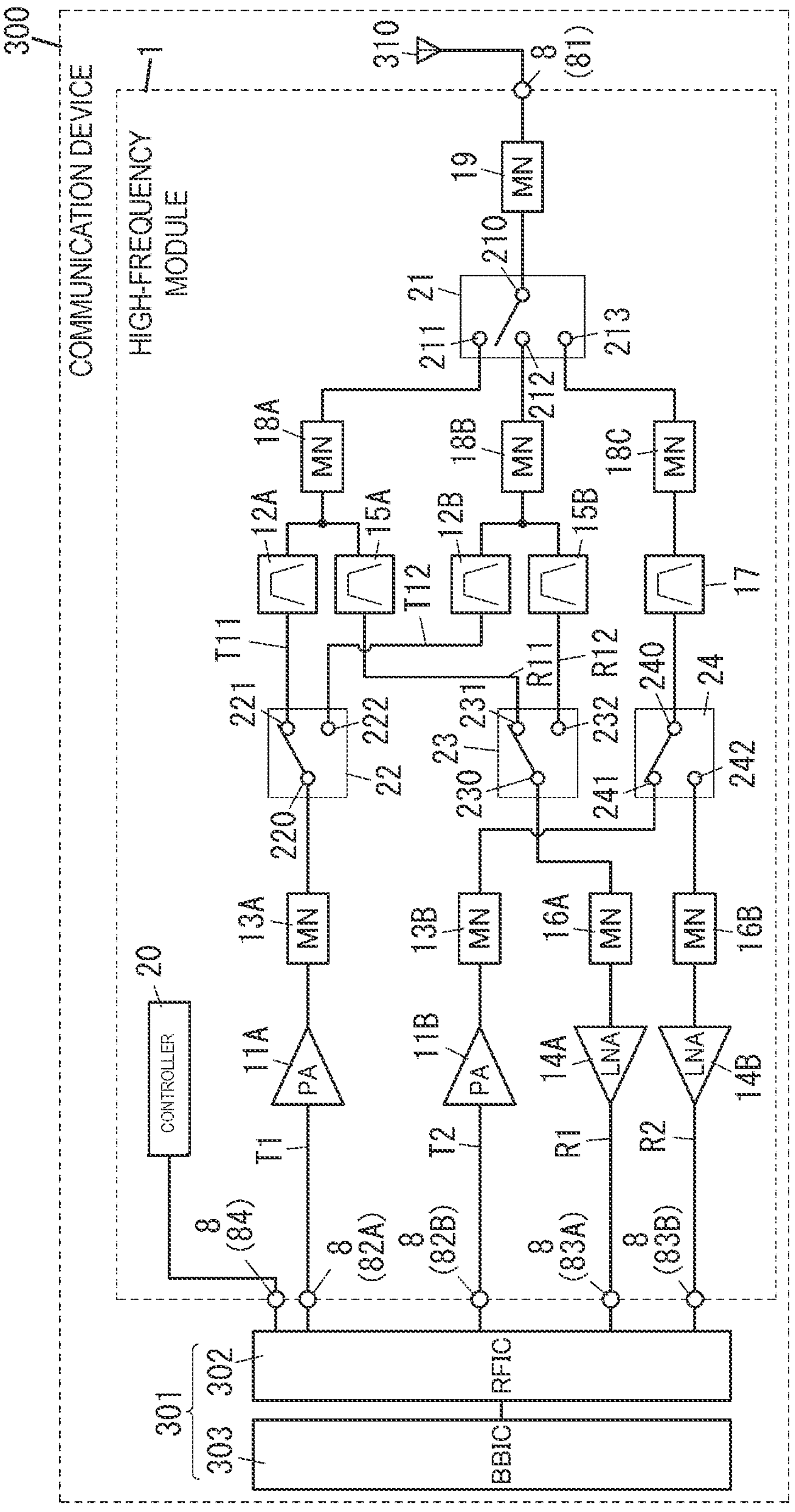
FIG. 1 is a block diagram of a high-frequency module and a communication device according to an embodiment.

As illustrated in FIG. 1, the communication device 300 includes the high-frequency module 1. For example, the communication device 300 is a mobile terminal (for example, a smartphone), but is not limited to the mobile terminal. For example, the communication device 300 may be a wearable terminal (for example, a smart watch). The high-frequency module 1 is compatible with, for example, the 4G (Fourth Generation Mobile Communication) standard and the 5G (Fifth Generation Mobile Communication) standard. For example, the 4G standard is the 3GPP (registered trademark; Third Generation Partnership Project) LTE (registered trademark; Long Term Evolution) standard. For example, the 5G standard is 5G NR (New Radio). The high-frequency module 1 is compatible with carrier aggregation and dual connectivity.

The communication device 300 includes a signal processing circuit 301 and at least one (one in the example illustrated in FIG. 1) antenna 310 in addition to the high-frequency module 1.

The high-frequency module 1 amplifies a reception signal (high-frequency signal) received by the antenna 310, and outputs the reception signal to the signal processing circuit 301. The high-frequency module 1 amplifies a transmission signal from the signal processing circuit 301, and outputs the transmission signal to the antenna 310. For example, the high-frequency module 1 is controlled by the signal processing circuit 301.

The signal processing circuit 301 processes high-frequency signals (transmission signal and reception signal) that pass through the high-frequency module 1. More specifically, the signal processing circuit 301 performs signal processing on a reception signal received from the high-frequency module 1. The signal processing circuit 301 performs signal processing on a transmission signal to be outputted to the high-frequency module 1. The signal processing circuit 301 includes an RF signal processing circuit 302 and a baseband signal processing circuit 303.

For example, the RF signal processing circuit 302 is an RFIC (Radio Frequency Integrated Circuit), and performs signal processing on a high-frequency signal (reception signal). For example, the RF signal processing circuit 302 performs signal processing such as down-conversion on a reception signal received from the high-frequency module 1, and outputs the reception signal to the baseband signal processing circuit 303. The RF signal processing circuit 302 performs signal processing such as up-conversion on a transmission signal outputted from the baseband signal processing circuit 303, and outputs the transmission signal to the high-frequency module 1.

For example, the baseband signal processing circuit 303 is a BBIC (Baseband Integrated Circuit). The baseband signal processing circuit 303 outputs a reception signal received from the RF signal processing circuit 302 to the outside. For example, the output signal (reception signal) is used as an image signal to display an image, or as an audio signal to make a telephone conversation. The baseband signal processing circuit 303 generates a transmission signal from a baseband signal (for example, an audio signal or an image signal) inputted from the outside, and outputs the generated transmission signal to the RF signal processing circuit 302.

(2-2) Example of Circuit Structure of High-Frequency Module

As illustrated in FIG. 1, the high-frequency module 1 transfers high-frequency signals (for example, a reception signal and a transmission signal) between the antenna 310 and the signal processing circuit 301.

The high-frequency module 1 further includes two power amplifiers (PA) 11A and 11B and two low-noise amplifiers (LNA) 14A and 14B. The high-frequency module 1 further includes two transmission filters 12A and 12B, two reception filters 15A and 15B, and one transmission/reception filter 17. The high-frequency module 1 further includes a first switch 21, a second switch 22, a third switch 23, and a fourth switch 24. The high-frequency module 1 further includes two output matching circuits (MN) 13A and 13B, three matching circuits 18A, 18B, and 18C, two input matching circuits 16A and 16B, and one matching circuit 19. The high-frequency module 1 further includes a controller 20.

The high-frequency module 1 includes a plurality of external connection electrodes 8. The plurality of external connection electrodes 8 includes an antenna terminal 81, two signal input terminals 82A and 82B, two signal output terminals 83A and 83B, and a control terminal 84. The antenna 310 is connected to the antenna terminal 81. The two signal input terminals 82A and 82B each input a high-frequency signal (transmission signal) from the signal processing circuit 301 to the high-frequency module 1. The two signal output terminals 83A and 83B each output a high-frequency signal (reception signal) from the high-frequency module 1 to the signal processing circuit 301. The control terminal 84 inputs a control signal from the signal processing circuit 301 to the controller 20.

The power amplifier 11A is provided on a transmission path T1 connected to the signal input terminal 82A. The power amplifier 11A amplifies and outputs a transmission signal from the signal processing circuit 301. More specifically, the power amplifier 11A amplifies and outputs a transmission signal in a first predetermined frequency band that is inputted from the signal processing circuit 301 via the signal input terminal 82A. For example, the first predetermined frequency band includes a first communication band and a second communication band. The first communication band is associated with a transmission signal that passes through the transmission filter 12A. The second communication band is associated with a transmission signal that passes through the transmission filter 12B.

The power amplifier 11A includes an input terminal and an output terminal. The input terminal of the power amplifier 11A is connected to the signal input terminal 82A. Thus, the input terminal of the power amplifier 11A is connected to the signal processing circuit 301 via the signal input terminal 82A. The output terminal of the power amplifier 11A is connected to a common terminal 220 of the second switch 22 via the output matching circuit 13A.

The power amplifier 11B is provided on a transmission path T2 connected to the signal input terminal 82B. The power amplifier 11B amplifies and outputs a transmission signal from the signal processing circuit 301. More specifically, the power amplifier 11B amplifies and outputs a transmission signal in a second predetermined frequency band that is inputted from the signal processing circuit 301 via the signal input terminal 82B. For example, the second predetermined frequency band includes a third communication band. The third communication band is associated with a transmission signal that passes through the transmission/reception filter 17.

The power amplifier 11B includes an input terminal and an output terminal. The input terminal of the power amplifier 11B is connected to the signal input terminal 82B. Thus, the input terminal of the power amplifier 11B is connected to the signal processing circuit 301 via the signal input terminal 82B. The output terminal of the power amplifier 11B is connected to a selective terminal 241 of the fourth switch 24 via the output matching circuit 13B.

The output matching circuit 13A is provided between the output terminal of the power amplifier 11A and the common terminal 220 of the second switch 22. The output matching circuit 13A performs the impedance matching between the power amplifier 11A and the transmission filters 12A and 12B. The output matching circuit 13B is provided between the output terminal of the power amplifier 11B and the selective terminal 241 of the fourth switch 24. The output matching circuit 13B performs the impedance matching between the power amplifier 11B and the transmission/reception filter 17.

The low-noise amplifier 14A includes an input terminal and an output terminal. The low-noise amplifier 14A is provided on a reception path R1 connected to the signal output terminal 83A. The low-noise amplifier 14A amplifies a reception signal in the first predetermined frequency band that is inputted to the input terminal of the low-noise amplifier 14A, and outputs the reception signal from the output terminal of the low-noise amplifier 14A. The input terminal of the low-noise amplifier 14A is connected to a common terminal 230 of the third switch 23 via the input matching circuit 16A. The output terminal of the low-noise amplifier 14A is connected to the signal output terminal 83A. Thus, the output terminal of the low-noise amplifier 14A is connected to the signal processing circuit 301 via the signal output terminal 83A.

The low-noise amplifier 14B includes an input terminal and an output terminal. The low-noise amplifier 14B is provided on a reception path R2 connected to the signal output terminal 83B. The low-noise amplifier 14B amplifies a reception signal in the second predetermined frequency band that is inputted to the input terminal of the low-noise amplifier 14B, and outputs the reception signal from the output terminal of the low-noise amplifier 14B. The input terminal of the low-noise amplifier 14B is connected to a selective terminal 242 of the fourth switch 24 via the input matching circuit 16B. The output terminal of the low-noise amplifier 14B is connected to the signal output terminal 83B. Thus, the output terminal of the low-noise amplifier 14B is connected to the signal processing circuit 301 via the signal output terminal 83B.

The input matching circuit 16A is provided between the input terminal of the low-noise amplifier 14A and the common terminal 230 of the third switch 23. The input matching circuit 16A performs the impedance matching between the low-noise amplifier 14A and the reception filters 15A and 15B. The input matching circuit 16B is provided between the input terminal of the low-noise amplifier 14B and the selective terminal 242 of the fourth switch 24. The input matching circuit 16B performs the impedance matching between the low-noise amplifier 14B and the transmission/reception filter 17.

The transmission filter 12A is connected between a selective terminal 221 of the second switch 22 and the matching circuit 18A. The pass band of the transmission filter 12A is a transmission band of the first communication band. The transmission filter 12B is connected between a selective terminal 222 of the second switch 22 and the matching circuit 18B. The pass band of the transmission filter 12B is a transmission band of the second communication band. The reception filter 15A is connected between a selective terminal 231 of the third switch 23 and the matching circuit 18A. The pass band of the reception filter 15A is a reception band of the first communication band. The reception filter 15B is connected between a selective terminal 232 of the third switch 23 and the matching circuit 18B. The pass band of the reception filter 15B is a reception band of the second communication band. The transmission/reception filter 17 is connected between a common terminal 240 of the fourth switch 24 and the matching circuit 18C. The pass band of the transmission/reception filter 17 is a transmission band and a reception band of the third communication band.

For example, the transmission filters 12A and 12B, the reception filters 15A and 15B, and the transmission/reception filter 17 are acoustic wave filters. The acoustic wave filter is a surface acoustic wave (SAW) filter that uses a surface acoustic wave. The transmission filters 12A and 12B, the reception filters 15A and 15B, and the transmission/reception filter 17 are not limited to the SAW filters, and may be, for example, BAW (Bulk Acoustic Wave) filters instead of the SAW filters.

The first switch 21 is an antenna switch connected to the antenna terminal 81. The first switch 21 includes a common terminal 210 and a plurality of (three in this case) selective terminals 211, 212 and 213. The common terminal 210 is connected to the antenna terminal 81. The antenna 310 is connected to the antenna terminal 81. The selective terminal 211 is connected to a connection point between an output terminal of the transmission filter 12A and an input terminal of the reception filter 15A via the matching circuit 18A. The selective terminal 212 is connected to a connection point between an output terminal of the transmission filter 12B and an input terminal of the reception filter 15B via the matching circuit 18B. The selective terminal 213 is connected to the transmission/reception filter 17 via the matching circuit 18C. In the first switch 21, at least one of the plurality of (three in this case) selective terminals 211 to 213 is connectable to the common terminal 210. For example, the first switch 21 is a switch capable of one-to-one and one-to-many connection.

The first switch 21 is controlled by the controller 20. The first switch 21 switches the connection state between the common terminal 210 and the plurality of selective terminals 211 to 213 based on a control signal from the controller 20. For example, the first switch 21 is a switch IC (Integrated Circuit).

The second switch 22 is a band selection switch for switching signal paths for a plurality of transmission signals in different communication bands. The second switch 22 includes the common terminal 220 and the plurality of (two in this case) selective terminals 221 and 222. The common terminal 220 is connected to the output terminal of the power amplifier 11A via the output matching circuit 13A. The selective terminal 221 is connected to an input terminal of the transmission filter 12A. The selective terminal 222 is connected to an input terminal of the transmission filter 12B. In the second switch 22, at least one of the plurality of selective terminals 221 and 222 is connectable to the common terminal 220. For example, the second switch 22 is a switch capable of one-to-one and one-to-many connection.

The second switch 22 is controlled by the controller 20. The second switch 22 switches the connection state between the common terminal 220 and the plurality of selective terminals 221 and 222 based on a control signal from the controller 20. For example, the second switch 22 is a switch IC.

The third switch 23 includes the common terminal 230 and the plurality of selective terminals 231 and 232. The common terminal 230 is connected to the input terminal of the low-noise amplifier 14A via the input matching circuit 16A. The selective terminal 231 is connected to an output terminal of the reception filter 15A. The selective terminal 232 is connected to an output terminal of the reception filter 15B. In the third switch 23, at least one of the plurality of selective terminals 231 and 232 is connectable to the common terminal 230. For example, the third switch 23 is a switch capable of one-to-one and one-to-many connection.

The third switch 23 is controlled by the controller 20. The third switch 23 switches the connection state between the common terminal 230 and the plurality of selective terminals 231 and 232 based on a control signal from the controller 20. For example, the third switch 23 is a switch IC.

The matching circuit 18A is provided between each of the transmission filter 12A and the reception filter 15A and the selective terminal 211 of the first switch 21. The matching circuit 18A performs the impedance matching between the first switch 21 and each of the transmission filter 12A and the reception filter 15A. The matching circuit 18B is provided between each of the transmission filter 12B and the reception filter 15B and the selective terminal 212 of the first switch 21. The matching circuit 18B performs the impedance matching between the first switch 21 and each of the transmission filter 12B and the reception filter 15B. The matching circuit 18C is provided between the transmission/reception filter 17 and the selective terminal 213 of the first switch 21. The matching circuit 18C performs the impedance matching between the first switch 21 and the transmission/reception filter 17.

The controller 20 is a control device that controls electronic components such as the power amplifiers 11A and 11B, the low-noise amplifiers 14A and 14B, and the first to fourth switches 21 to 24 based on control signals from the signal processing circuit 301. The controller 20 is electrically connected to the electronic components described above. The controller 20 is connected to an output portion of the signal processing circuit 301 via the control terminal 84. The controller 20 controls the electronic components described above based on control signals inputted from the signal processing circuit 301 to the control terminal 84.

(2-3) Example of Operation of Communication Device

The high-frequency module 1 has first to third transmission paths T11, T12, and T2 and first to third reception paths R11, R12, and R2. The first transmission path T11 is a signal path that reaches the antenna terminal 81 via the power amplifier 11A, the output matching circuit 13A, the second switch 22, the transmission filter 12A, the matching circuit 18A, the first switch 21, and the matching circuit 19 in this order from the signal input terminal 82A. The second transmission path T12 is a signal path that reaches the antenna terminal 81 via the power amplifier 11A, the output matching circuit 13A, the second switch 22, the transmission filter 12B, the matching circuit 18B, the first switch 21, and the matching circuit 19 in this order from the signal input terminal 82A. The third transmission path T2 is a signal path that reaches the antenna terminal 81 via the power amplifier 11B, the output matching circuit 13B, the fourth switch 24, the transmission/reception filter 17, the matching circuit 18C, the first switch 21, and the matching circuit 19 in this order from the signal input terminal 82B. The first reception path R11 is a signal path that reaches the signal output terminal 83A via the matching circuit 19, the first switch 21, the matching circuit 18A, the reception filter 15A, the third switch 23, the input matching circuit 16A, and the low-noise amplifier 14A in this order from the antenna terminal 81. The second reception path R12 is a signal path that reaches the signal output terminal 83A via the matching circuit 19, the first switch 21, the matching circuit 18B, the reception filter 15B, the third switch 23, the input matching circuit 16A, and the low-noise amplifier 14A in this order from the antenna terminal 81. The third reception path R2 is a signal path that reaches the signal output terminal 83B via the matching circuit 19, the first switch 21, the matching circuit 18C, the transmission/reception filter 17, the fourth switch 24, the input matching circuit 16B, and the low-noise amplifier 14B in this order from the antenna terminal 81.

In the communication device 300, any one set out of a set of the transmission path T11 and the reception path R11, a set of the transmission path T12 and the reception path R12, and a set of the transmission path T2 and the reception path R2 is selectable by the first switch 21. One of the transmission paths T11 and T12 is selectable by the second switch 22. One of the reception paths R11 and R12 is selectable by the third switch 23. One of the transmission path T2 and the reception path R2 is selectable by the fourth switch 24.

To transmit the transmission signal by using, for example, the transmission path T11, the set of the transmission path T11 and the reception path R11 is selected by the first switch 21 from among the three sets, and the transmission path T11 is selected by the second switch 22 out of the transmission paths T11 and T12. Thus, the transmission signal from the signal processing circuit 301 is transmitted from the antenna 310 through the transmission path T11.

To receive the reception signal by using, for example, the reception path R12, the set of the transmission path T12 and the reception path R12 is selected by the first switch 21 from among the three sets, and the reception path R12 is selected by the third switch 23 out of the reception paths R11 and R12. Thus, the reception signal received by the antenna 310 is outputted from the signal output terminal 83A to the signal processing circuit 301 through the reception path R12, and is subjected to signal processing by the signal processing circuit 301.

(2-4) Example of Structure of High-Frequency Module

An example of the structure of the high-frequency module 1 is described with reference to FIG. 2 to FIG. 5. In this embodiment, a case where the mounting board 3 (e.g., in FIGS. 2 to 4) has a single-sided mounting structure is described as an example of the structure of the high-frequency module 1 (e.g., in FIGS. 1 to 3)

Figure 2:
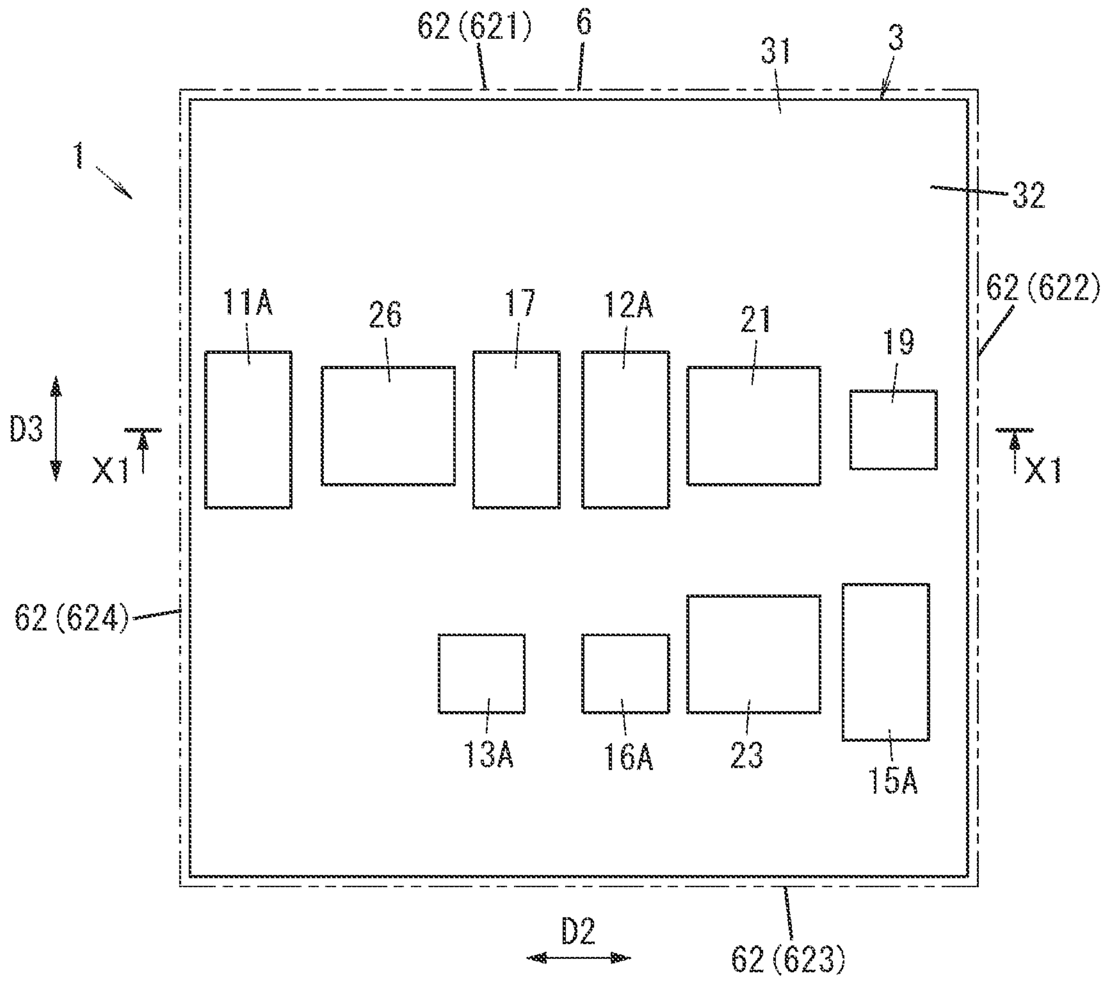
FIG. 2 is a plan view of a first principal surface of a mounting board of the high-frequency module that is viewed from the first principal surface side.

In the following description, a thickness direction D1 of the mounting board 3 may be referred to as "first direction D1" as illustrated in FIG. 3. As illustrated in FIG. 3, a certain direction orthogonal to the first direction D1 (for example, a direction parallel to one set of opposite sides out of the two sets of opposite sides of the second principal surface 32 of the mounting board 3 (see FIG. 2)) is referred to as "second direction D2". As illustrated in FIG. 2, a direction orthogonal to both the first direction D1 and the second direction D2 (for example, a direction parallel to the other set of opposite sides out of the two sets of opposite sides of the second principal surface 32) is referred to as "third direction D3".

On the drawing sheet of FIG. 3, an upper side in the first direction D1 and a lower side in the first direction D1 may be referred to simply as "upper side" and "lower side", respectively. On the drawing sheets of FIG. 2 and FIG. 3, a left side in the second direction D2 and a right side in the second direction D2 may be referred to simply as "left side" and "right side", respectively. On the drawing sheet of FIG. 2, an upper side in the third direction D3 and a lower side in the third direction D3 may be referred to simply as "rear side" and "front side", respectively.

As illustrated in FIG. 3, the high-frequency module 1 includes the mounting board 3, a plurality of electronic components 4, the plurality of external connection electrodes 8, the first ground electrode 6, and the first resin layer 51.

The mounting board 3 is a board where the plurality of electronic components 4 is disposed, and has, for example, a rectangular plate shape. The mounting board 3 has the first principal surface 31 and the second principal surface 32 facing each other in the thickness direction D1 of the mounting board 3. For example, the first principal surface 31 and the second principal surface 32 each have a rectangular shape.

The mounting board 3 is a board having a plurality of layers (multilayer board) including a plurality of dielectric layers 37 and a plurality of conductive layers (not illustrated). The plurality of dielectric layers and the plurality of conductive layers are laminated in the thickness direction D1 of the mounting board 3. The plurality of conductive layers is formed in patterns predetermined for the individual layers. For example, the mounting board 3 is an LTCC (Low Temperature Co-fired Ceramics) board. The mounting board 3 is not limited to the LTCC board, and may be, for example, a printed wiring board, an HTCC (High Temperature Co-fired Ceramics) board, or a resin multilayer board.

The mounting board 3 includes the second ground electrode 34, a plurality of vias 35 (thermal vias), and a plurality of pad electrodes (not illustrated) in addition to the plurality of layers described above.

The second ground electrode 34 is a part that functions as a ground layer of the mounting board 3, and is provided inside the mounting board 3. The second ground electrode 34 may be provided on the second principal surface 32 of the mounting board 3. When the high-frequency module 1 is disposed on an external board 304 (for example, a motherboard), the second ground electrode 34 is connected to a ground of the external board 304 and kept at a ground potential (reference potential). The second ground electrode 34 has a layer shape (film shape) to extend parallel to the first principal surface 31 of the mounting board 3. Both end portions of the second ground electrode 34 in the second direction D2 are exposed from the mounting board 3 on an outer peripheral surface 33 of the mounting board 3.

The plurality of vias 35 is, for example, columnar conductive members and provided inside the mounting board 3. The plurality of vias 35 connects the external connection electrodes 8 disposed on the second principal surface 32 of the mounting board 3 to the second ground electrode 34. The upper end surface of the via 35 (end surface on the first principal surface 31 side) is connected to (for example, in contact with) the second ground electrode 34, and the lower end surface of the via 35 (end surface on the second principal surface 32 side) is exposed from the second principal surface 32 and connected to (for example, in contact with) the external connection electrode 8.

The plurality of pad electrodes is, for example, conductive members having a flat-plate shape to which external terminals (not illustrated) of the electronic components 4 are connected. The plurality of pad electrodes is disposed on the first principal surface 31 of the mounting board 3. The plurality of pad electrodes is connected to the plurality of conductive layers of the mounting board 3 described above.

The plurality of electronic components 4 includes the power amplifiers 11A and 11B, the low-noise amplifiers 14A and 14B, the transmission filters 12A and 12B, the reception filters 15A and 15B, and the transmission/reception filter 17. The plurality of electronic components 4 further includes the first switch 21, the third switch 23, the fourth switch 24, the output matching circuits 13A and 13B, the matching circuits 18A, 18B, and 18C, the input matching circuits 16A and 16B, the matching circuit 19, and an IC chip 26. The IC chip 26 is a semiconductor device including the controller 20 and the second switch 22 in a single chip.

The plurality of electronic components 4 is disposed on the first principal surface 31 of the mounting board 3. The description "A (for example, the electronic component 4) is disposed on the first principal surface 31 of the mounting board 3" herein means not only that A is mounted directly on the first principal surface 31, but also that A is disposed in the space on the first principal surface 31 side that is separated by the mounting board 3 out of the space on the first principal surface 31 side and the space on the second principal surface 32 side that are separated by the mounting board 3. That is, the description inclusively means that A is mounted on the first principal surface 31 with other circuit elements and electrodes interposed therebetween.

More specifically, the plurality of electronic components 4 includes external terminals (not illustrated). The plurality of electronic components 4 is disposed on the first principal surface 31 of the mounting board 3 such that the external terminals are connected to the pad electrodes provided on the first principal surface 31 of the mounting board 3. The description "A (for example, the external terminal) is connected to B (for example, the pad electrode)" herein means not only that A is in contact with B, but inclusively that A and B are electrically connected to each other via a conductive electrode, a conductive terminal, a wire, or any other circuit component. In this embodiment, the external terminal of the electronic component 4 and the pad electrode on the first principal surface 31 of the mounting board 3 are connected to each other via a connection member 44 made of a conductor (for example, a solder bump).

The example of FIG. 2 illustrates only the power amplifier 11A, the transmission filter 12A, the transmission/reception filter 17, the first switch 21, the third switch 23, the output matching circuit 13A, the reception filter 15A, the input matching circuit 16A, the matching circuit 19, and the IC chip 26. More specifically, the power amplifier 11A, the IC chip 26, the transmission/reception filter 17, the transmission filter 12A, the first switch 21, and the matching circuit 19 are arranged in line along the second direction D2 at the center of the first principal surface 31 of the mounting board 3 in the third direction D3. The power amplifier 11A, the IC chip 26, the transmission/reception filter 17, the transmission filter 12A, the first switch 21, and the matching circuit 19 are arranged in this order from the left end side to the right end side in the second direction D2. The output matching circuit 13A, the input matching circuit 16A, the third switch 23, and the reception filter 15A are arranged in line along the second direction D2 at the lower edge portion of the first principal surface 31 of the mounting board 3 in the third direction D3. The output matching circuit 13A, the input matching circuit 16A, the third switch 23, and the reception filter 15A are arranged in this order from the left end side to the right end side in the second direction D2.

Referring back to FIG. 3, the plurality of external connection electrodes 8 is, for example, conductive members having a flat-plate shape and connected to external connection electrodes 305 of the external board 304 (for example, the motherboard). The external connection electrodes 305 are disposed on a principal surface 306 of the external board 304 on the mounting board 3 side. The plurality of external connection electrodes 8 is disposed on the second principal surface 32 of the mounting board 3. The description "A (for example, the external connection electrode 8) is connected to B (for example, the external connection electrode 305)" herein means not only that A is in contact with B, but inclusively that A and B are electrically connected to each other via a conductive electrode, a conductive terminal, a wire, or any other circuit component. In this embodiment, the plurality of external connection electrodes 8 is connected to the external connection electrodes 305 of the external board 304 via connection members 85 made of conductors (for example, determination bumps).

Figure 4:
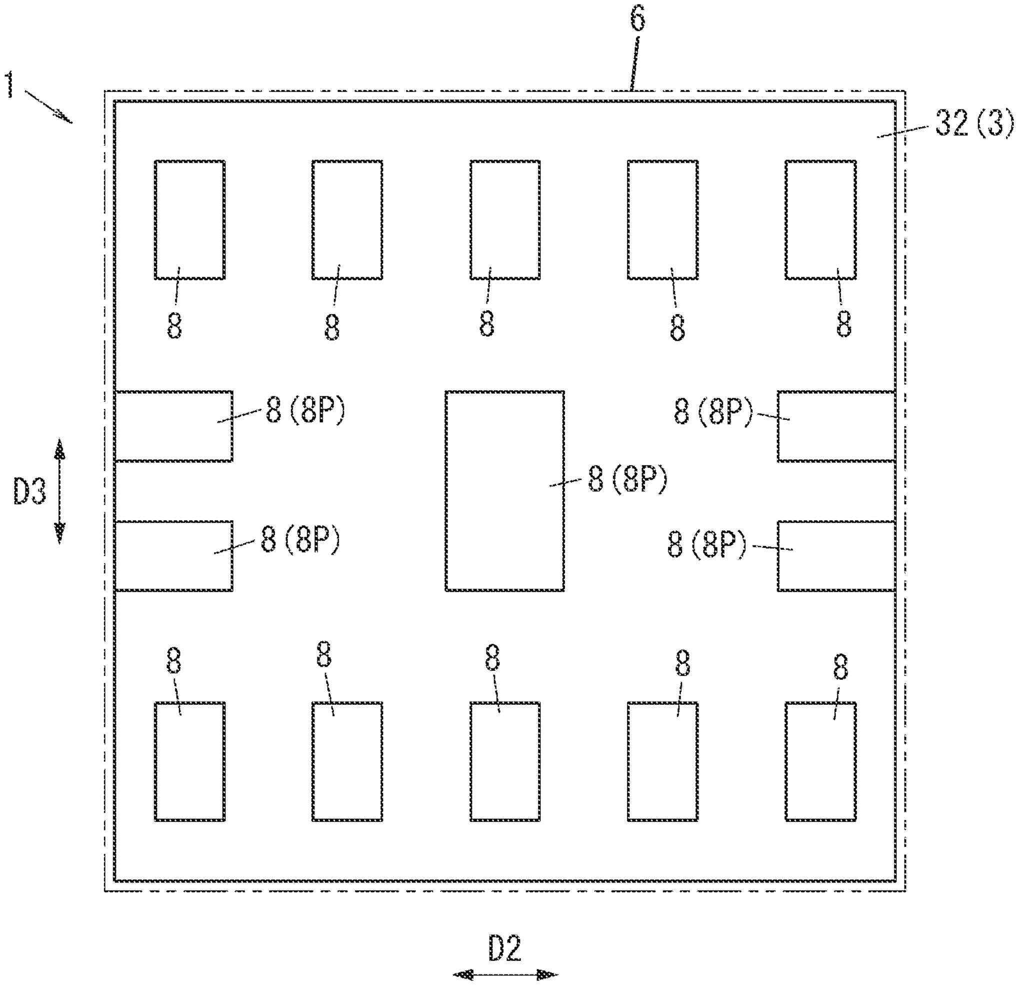
FIG. 4 is a plan view of a second principal surface of the mounting board of the high-frequency module that is viewed from the first principal surface side in a see-through fashion.

More specifically, the plurality of external connection electrodes 8 is disposed at the peripheral edge and the center of the second principal surface 32 of the mounting board 3 as illustrated in FIG. 4. One external connection electrode 8 out of the plurality of external connection electrodes 8 is disposed at the center of the second principal surface 32 of the mounting board 3, and the remaining external connection electrodes 8 are disposed at the peripheral edge of the second principal surface 32 of the mounting board 3. The plurality of external connection electrodes 8 disposed at the peripheral edge of the second principal surface 32 is arranged away from each other in directions along the periphery of the second principal surface 32.

In this embodiment, specific external connection electrodes 8P out of the plurality of external connection electrodes 8 are connected to the second ground electrode 34 of the mounting board 3 (see FIG. 3), and the remaining external connection electrodes 8 are not connected to the second ground electrode 34. For example, the specific external connection electrodes 8P are the external connection electrode 8 at the center of the second principal surface 32, and the external connection electrodes 8 on both sides in the second direction D2 across the central external connection electrode 8.

Figure 5:
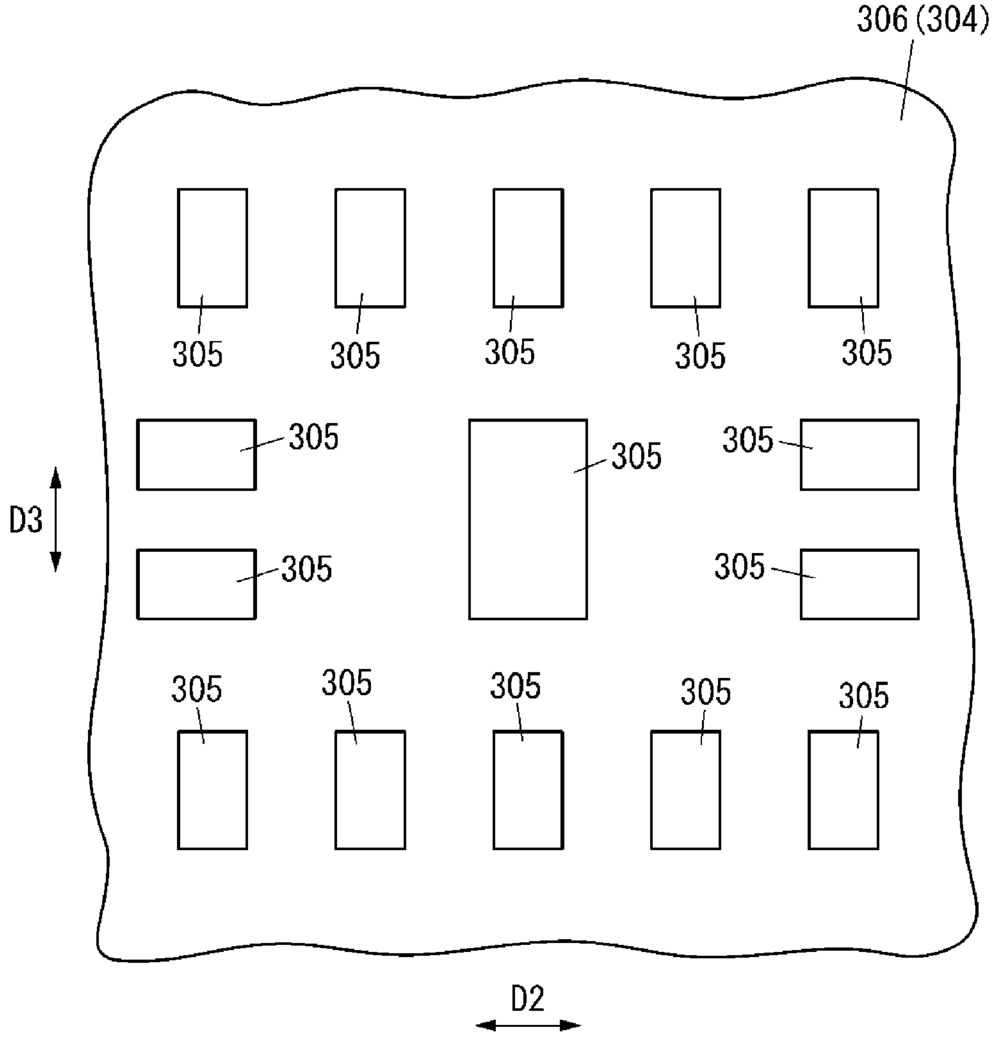
FIG. 5 is a plan view of a first principal surface of an external board that is viewed from the high-frequency module side.

As illustrated in FIG. 5, the plurality of external connection electrodes 305 of the external board 304 is disposed on the first principal surface 306 of the external board 304 so as to face the plurality of external connection electrodes 8 of the high-frequency module 1. The first principal surface 306 is a principal surface of the external board 304 on the mounting board 3 side. More specifically, one external connection electrode 305 out of the plurality of external connection electrodes 305 is disposed at a predetermined position on the first principal surface 306 of the external board 304, and the remaining external connection electrodes 305 are arranged in a loop around the one external connection electrode 305 described above.

Referring back to FIG. 3, the transmission filter 12A includes a substrate 120A, a circuit portion (not illustrated), and external terminals (not illustrated). For example, the substrate 120A has a flat-plate shape. The substrate 120A has the first principal surface 121A and a second principal surface 122A facing each other. The first principal surface 121A is a principal surface opposite to the mounting board 3 (referred to also as "top surface"). The second principal surface 122A is a principal surface on the mounting board 3 side (referred to also as "back surface"). For example, the substrate 120A is a silicon substrate or a piezoelectric substrate. The circuit portion includes a circuit that performs a filtering process on the transmission signal. The circuit portion is disposed on the second principal surface 122A of the substrate 120A. The external terminal is a part connected to the pad electrode of the mounting board 3 described above via the connection member 44, and is disposed on the second principal surface 122A of the substrate 120A.

The transmission/reception filter 17 includes a substrate 170, a circuit portion (not illustrated), and external terminals (not illustrated). For example, the substrate 170 has a flat-plate shape. The substrate 170 has the first principal surface 171 and a second principal surface 172 facing each other. The first principal surface 171 is a principal surface opposite to the mounting board 3 (referred to also as "top surface"). The second principal surface 172 is a principal surface on the mounting board 3 side (referred to also as "back surface"). For example, the substrate 170 is a silicon substrate or a piezoelectric substrate. The circuit portion includes a circuit that performs a filtering process on the transmission signal and the reception signal. The circuit portion is disposed on the second principal surface 172 of the substrate 170. The external terminal is a part connected to the pad electrode of the mounting board 3 described above via the connection member 44, and is disposed on the second principal surface 172 of the substrate 170.

In this embodiment, the first principal surface 121A of the transmission filter 12A (first electronic component) and the first principal surface 171 of the transmission/reception filter 17 (first electronic component) are connected to the first ground electrode 6 as described later. Therefore, the first principal surface 121A of the transmission filter 12A and the first principal surface 171 of the transmission/reception filter 17 are higher in terms of the height from the first principal surface 31 of the mounting board 3 than the first principal surfaces (principal surfaces opposite to the mounting board 3) of the other electronic components 4 disposed on the first principal surface 31 of the mounting board 3. The first principal surface 121A of the transmission filter 12A and the first principal surface 171 of the transmission/reception filter 17 are disposed on the same plane.

The first resin layer 51 is provided on the first principal surface 31 of the mounting board 3. The first resin layer 51 covers at least a part of the outer surfaces (outer peripheral surface and top surface (principal surface opposite to the mounting board 3) of each of the plurality of electronic components 4 disposed on the first principal surface 31 of the mounting board 3. More specifically, the first resin layer 51 exposes the first principal surfaces 121A and 171 of the transmission filter 12A and the transmission/reception filter 17 and covers parts other than the first principal surfaces 121A and 171. That is, the first resin layer 51 covers at least a part of the outer peripheral surfaces of the transmission filter 12A and the transmission/reception filter 17 (for example, the entire outer peripheral surfaces). The first resin layer 51 covers the entire electronic components 4 other than the transmission filter 12A and the transmission/reception filter 17 out of the plurality of electronic components 4. The first resin layer 51 contains a resin. The first resin layer 51 may contain a filler in addition to the resin.

For example, the first ground electrode 6 is made of a metal. The first ground electrode 6 covers at least a part of an outer peripheral surface 512 of the first resin layer 51 (entire outer peripheral surface 512 in the example of FIG. 3) and at least a part of the outer peripheral surface 33 of the mounting board 3 (upper half area in the thickness direction D1 in the example of FIG. 3). One principal surface 511 of the first resin layer 51 is a principal surface of the first resin layer 51 opposite to the mounting board 3. More specifically, the first ground electrode 6 is connected in contact with both the end portions of the second ground electrode 34 exposed on the outer peripheral surface 33 of the mounting board 3. The first ground electrode 6 is not in contact with the external connection electrodes 8. The first ground electrode 6 covers at least a part of the first principal surface 121A of the transmission filter 12A and the first principal surface 171 of the transmission/reception filter 17 (entire first principal surfaces in the example of FIG. 3). That is, the first ground electrode 6 is connected in contact with the first principal surface 121A of the transmission filter 12A and the first principal surface 171 of the transmission/reception filter 17.

More specifically, the first ground electrode 6 includes a principal surface electrode 61 and a plurality of (for example, four) lateral surface electrodes 62 as illustrated in FIG. 3. The principal surface electrode 61 is a part that covers the one principal surface 511 of the first resin layer 51 and faces the first principal surface 31 of the mounting board 3. The plurality of lateral surface electrodes 62 is parts that cover the outer peripheral surface 512 of the first resin layer 51 and the outer peripheral surface 33 of the mounting board 3 and are disposed on the outer peripheral surface of the mounting board 3. The number of lateral surface electrodes 62 is equal to the number of sides of the external shape of the mounting board 3 that is viewed in the thickness direction D1 of the mounting board 3. In a case where the external shape of the mounting board 3 is a rectangular (quadrangular) shape, the number of lateral surface electrodes 62 is four (see FIG. 2). In this embodiment, the second ground electrode 34 is in contact with two lateral surface electrodes 62 on both sides in the second direction D2 out of the four lateral surface electrodes 62 of the first ground electrode 6 in at least both the end portions of the second ground electrode 34 in the second direction D2 (see FIG. 3).

(2-5) Heat Dissipation Paths for Transmission Filter and Transmission/Reception Filter As described above in this embodiment, the first principal surfaces (first principal surfaces 171 and 121A in the example of FIG. 3) of the specific electronic components 4 (transmission/reception filter 17 and transmission filter 12A in the example of FIG. 3) disposed on the transmission paths T11, T12, and T2 (see FIG. 1) out of the plurality of electronic components 4 are connected to the second ground electrode 34 via the first ground electrode 6 (see FIG. 3). The transmission path is a signal path along which the transmission signal passes.

Figure 6:
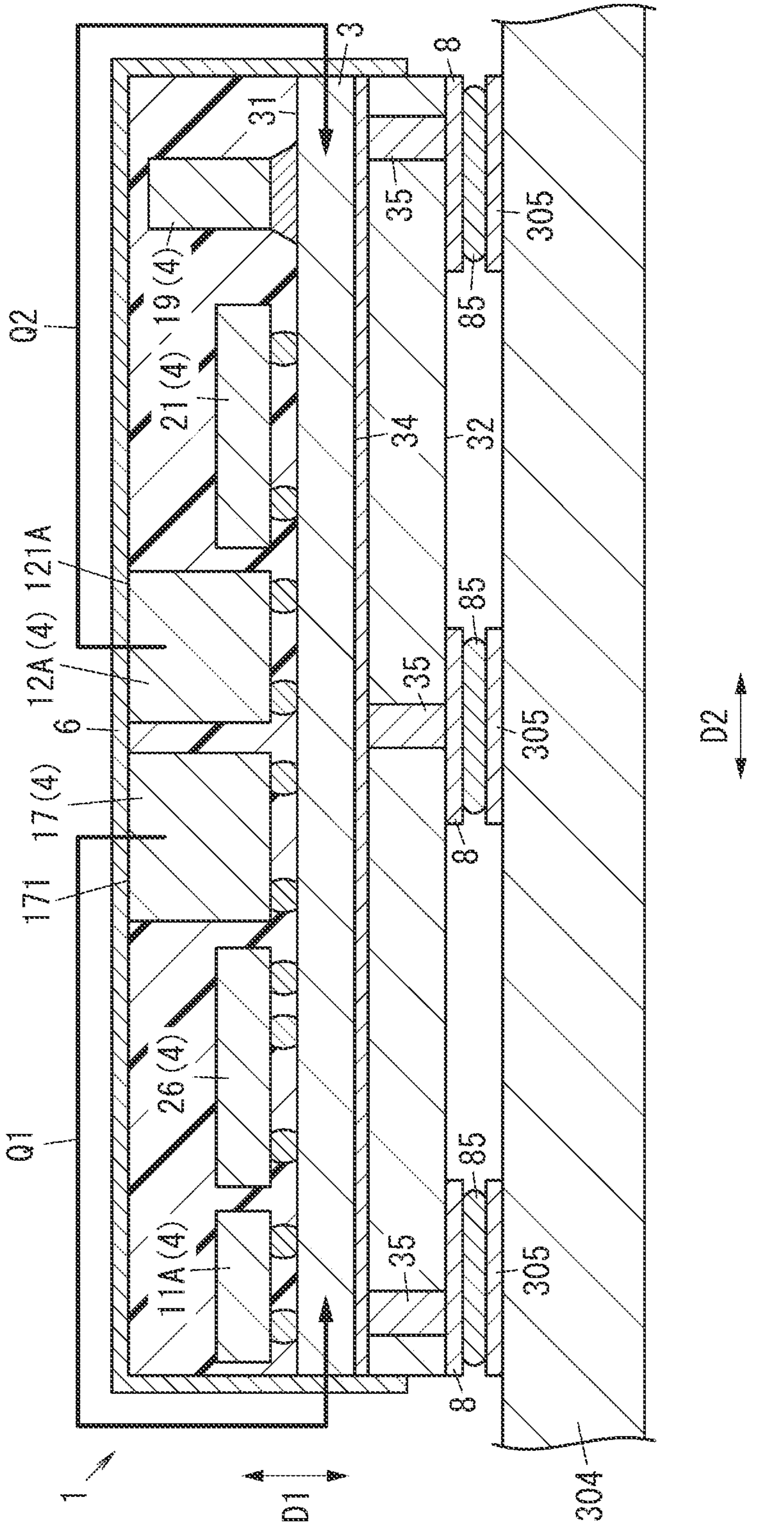
FIG. 6 is an explanatory view illustrating heat dissipation paths for a transmission filter and a transmission/reception filter of the high-frequency module.

More specifically, the first principal surface 171 of the transmission/reception filter 17 is connected to the first ground electrode 6 as illustrated in FIG. 3. The first ground electrode 6 is connected to both the end portions of the second ground electrode 34 of the mounting board 3 in the second direction D2. Thus, as illustrated in FIG. 6, the heat Q1 generated by the transmission/reception filter 17 is dissipated by being transferred from the first principal surface 171 of the transmission/reception filter 17 to the first ground electrode 6 and from the first ground electrode 6 to the second ground electrode 34. Accordingly, the heat dissipation performance for the transmission/reception filter 17 is improved. In this embodiment, the second ground electrode 34 is connected to the external connection electrodes 8 with the vias 35 interposed therebetween. Thus, the heat Q1 dissipated to the second ground electrode 34 is dissipated from the second ground electrode 34 to the external connection electrodes 8 through the vias 35.

Similarly, the first principal surface 121A of the transmission filter 12A is connected to the first ground electrode 6. The first ground electrode 6 is connected to both the end portions of the second ground electrode 34 of the mounting board 3 in the second direction D2. Thus, as illustrated in FIG. 6, the heat Q2 generated by the transmission filter 12A is dissipated by being transferred from the first principal surface 121A of the transmission filter 12A to the first ground electrode 6 and from the first ground electrode 6 to the second ground electrode 34. Accordingly, the heat dissipation performance for the transmission filter 12A is improved. In this embodiment, the second ground electrode 34 is connected to the external connection electrodes 8 with the vias 35 interposed therebetween. Thus, the heat Q2 dissipated to the second ground electrode 34 is dissipated from the second ground electrode 34 to the external connection electrodes 8 through the vias 35.

The heat generation amounts of the specific electronic components 4 disposed on the transmission paths T11, T12, and T2 (as shown in, e.g., FIG. 1) are larger than those of the electronic components 4 disposed on the reception paths R11, R12, and R2 (as shown in, e.g., FIG. 1). Therefore, the heat dissipation performance for the specific electronic components 4 is improved by connecting the first principal surfaces (for example, the first principal surfaces 171 and 121A) of the specific electronic components 4 (for example, the transmission/reception filter 17 and the transmission filter 12A) disposed on the transmission paths T11, T12, and T2 to the second ground electrode 34 via the first ground electrode 6 as described above. In this embodiment, the first principal surface 171 of the transmission/reception filter 17 and the first principal surface 121A of the transmission filter 12A are connected to the first ground electrode 6 as an example, but the first principal surfaces (principal surfaces opposite to the mounting board 3) of the electronic components 4 other than the transmission/reception filter 17 and the transmission filter 12A may be connected to the first ground electrode 6.

(3) Major Effects

The high-frequency module 1 according to this embodiment includes the mounting board 3, the first electronic components (for example, the transmission/reception filter 17 and the transmission filter 12A), the first resin layer 51 (e.g., in FIG. 3), and the first ground electrode 6. The mounting board 3 has the first principal surface 31 and the second principal surface 32 facing each other, as shown in, e.g., FIG. 3). The first electronic components 17 and 12A are disposed on the first principal surface 31 of the mounting board 3. The first resin layer 51 is provided on the first principal surface 31 of the mounting board 3 so as to cover at least a part of the outer surfaces of the first electronic components 17 and 12A. The first ground electrode 6 covers at least a part of the outer surface of the first resin layer 51. The principal surfaces 171 and 121A of the first electronic components 17 and 12A opposite to the mounting board 3 are connected to the first ground electrode 6. The mounting board 3 includes the second ground electrode 34. The first ground electrode 6 is connected to the second ground electrode 34.

In this structure, the principal surfaces 171 and 121A of the first electronic components 17 and 12A opposite to the mounting board 3 are connected to the first ground electrode 6, and the first ground electrode 6 is connected to the second ground electrode 34. Thus, the heat Q1 and the heat Q2 generated by the first electronic components 17 and 12A can be dissipated to the second ground electrode 34 through the first ground electrode 6. As a result, the heat dissipation performance for the first electronic components 17 and 12A can be improved.

(4) Modifications

Modifications of the embodiment described above are described. In the following description, the same constituent elements as those in the embodiment described above are represented by the same reference signs as those of the constituent elements in the embodiment described above and description thereof is omitted. Constituent elements different from those in the embodiment described above are mainly described. The modifications described below may be combined.

(4-1) First Modification

Figure 7:
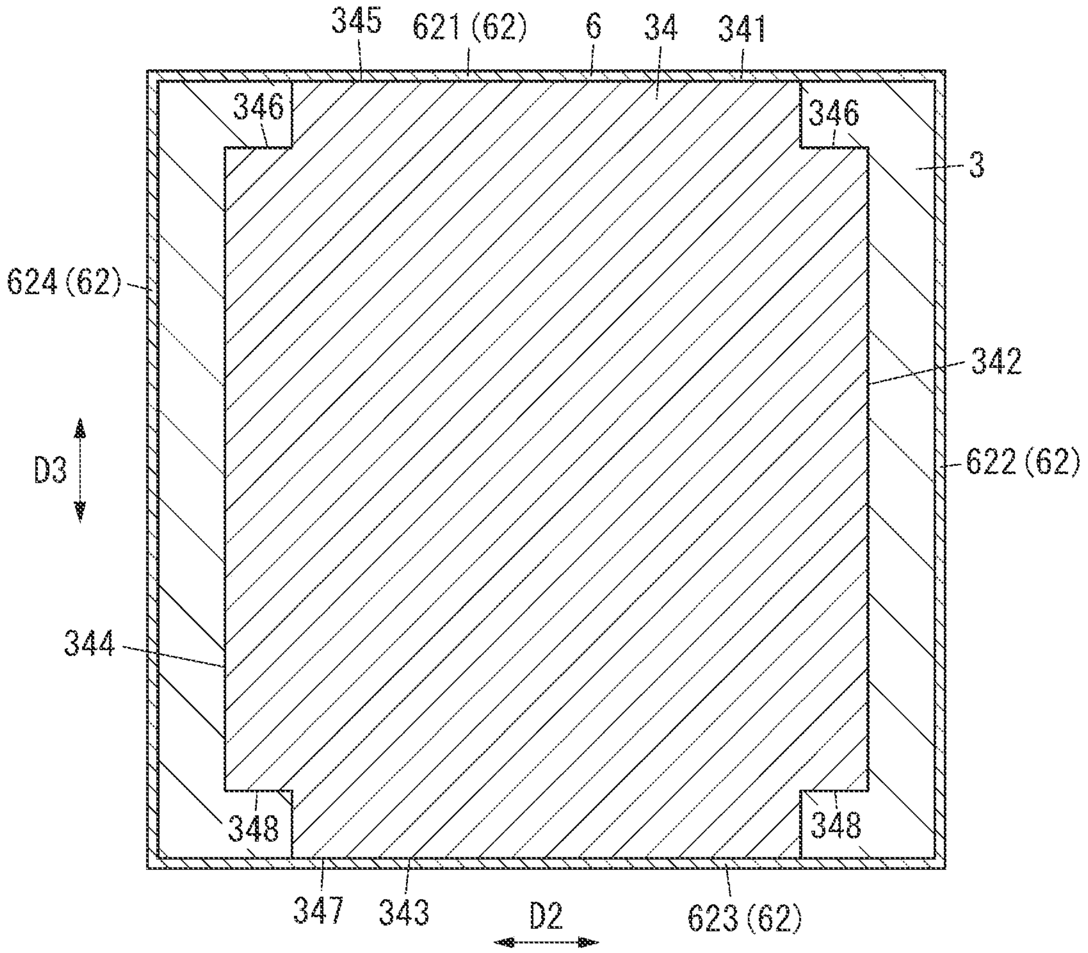
FIG. 7 is an explanatory view illustrating how a first ground electrode and a second ground electrode are connected in a first modification.

As illustrated in FIG. 7, in a high-frequency module of a first modification, the external shape of the second ground electrode 34 includes four sides 341, 342, 343 and 344 associated with the four lateral surface electrodes 62 (621, 622, 623 and 624) of the first ground electrode 6. At least one side (side 341 or 343 in the example of FIG. 7) out of the four sides 341 to 344 is in contact with the lateral surface electrode 62 (621, 623) of the first ground electrode 6 associated with the one side 341 or 343 in a half or more part of the one side 341 or 343 described above.

In the example of FIG. 7, the side 341 of the external shape of the second ground electrode 34 is in contact with the lateral surface electrode 621 associated with the side 341 in a half or more part of the side 341. The side 343 of the external shape of the second ground electrode 34 is in contact with the lateral surface electrode 623 associated with the side 343 in a half or more part of the side 343. More specifically, the side 341 includes a contact portion 345 that is in contact with the lateral surface electrode 621, and non-contact portions 346 that are not in contact with the lateral surface electrode 621. The contact portion 345 is bent so as to project toward the lateral surface electrode 621 relative to the non-contact portions 356. Similarly, the side 343 includes a contact portion 347 that is in contact with the lateral surface electrode 623, and non-contact portions 348 that are not in contact with the lateral surface electrode 623. The contact portion 347 is bent so as to project toward the lateral surface electrode 623 relative to the non-contact portions 348. Since the sides 341 and 343 associated with the lateral surface electrodes 621 and 623 are in contact with the associated lateral surface electrodes 621 and 623 in half or more parts of the sides, a sufficient contact areas can be provided between the sides 341 and 343 and the lateral surface electrodes 621 and 623. Thus, a sufficient thermal conduction can be provided between the first ground electrode 6 and the second ground electrode 34.

In the first modification, for example, the two sides 341 and 342 facing each other in the third direction D3 out of the four sides 341 to 344 of the second ground electrode 34 are in contact with the first ground electrode 6. Therefore, the thermal conduction between the first ground electrode 6 and the second ground electrode 34 can be improved compared with a case where two adjacent sides (for example, the sides 341 and 342) out of the four sides 341 to 344 of the second ground electrode 34 are in contact with the first ground electrode 6.

Figure 8:
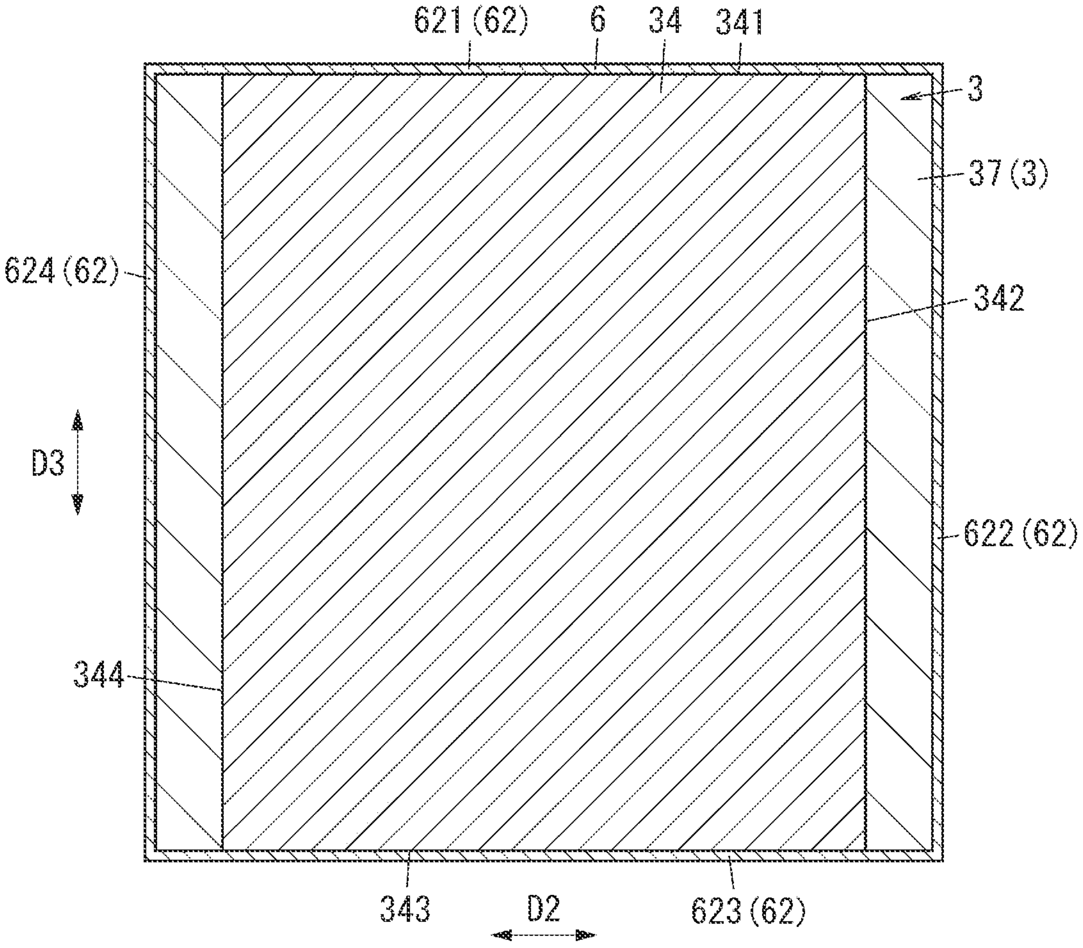
FIG. 8 is an explanatory view illustrating how the first ground electrode and the second ground electrode are connected in a modification of the first modification.

In the first modification, the sides 341 and 343 of the second ground electrode 34 are in contact with the associated lateral surface electrodes 621 and 623 in the parts 345 and 347 of the sides 341 and 343. As illustrated in FIG. 8, the sides 341 and 343 of the second ground electrode 34 may be in contact with the associated lateral surface electrodes 621 and 623 in the entire sides 341 and 343.

Figure 9:
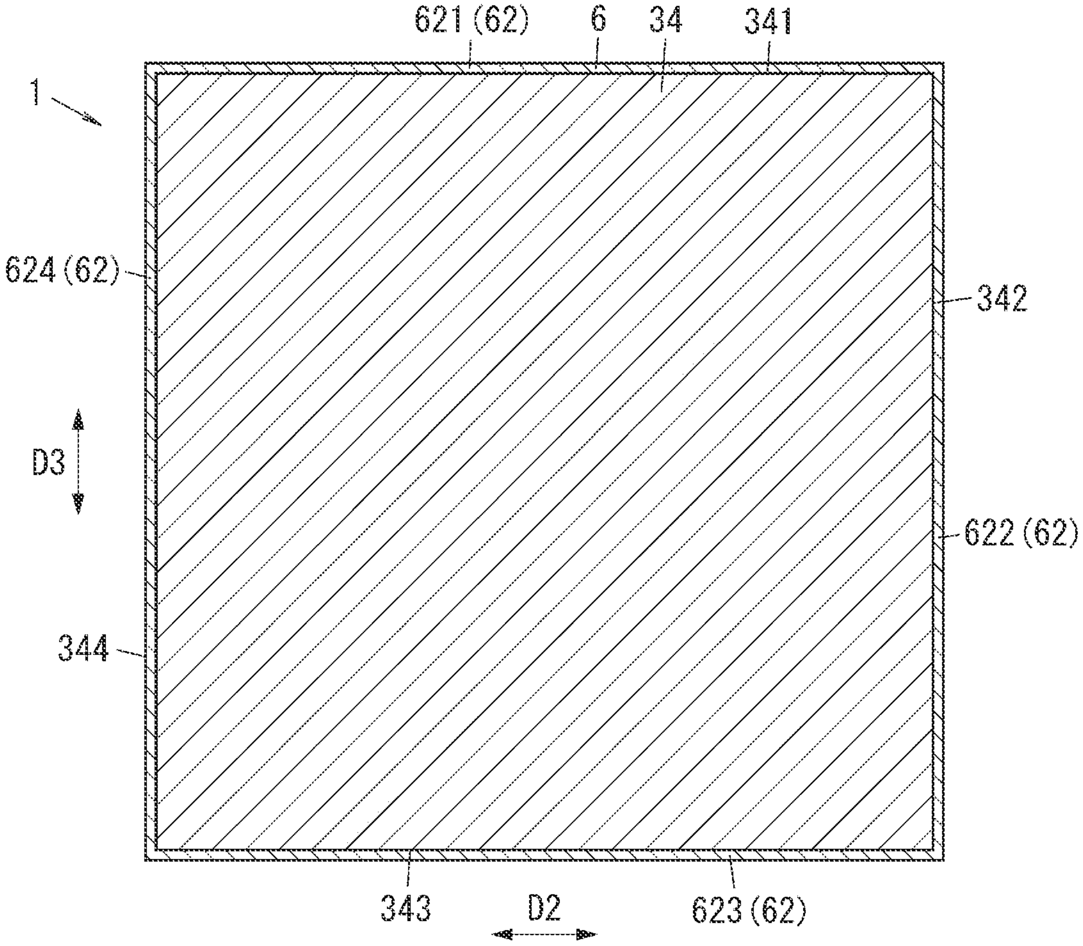
FIG. 9 is an explanatory view illustrating how the first ground electrode and the second ground electrode are connected in another modification of the first modification.

In the first modification, the two sides 341 and 344 out of the four sides 341, 342, 343 and 344 of the second ground electrode 34 are in contact with the associated lateral surface electrodes 621 and 624 in half or more parts of the sides. As illustrated in FIG. 9, all of the four sides 341, 342, 343 and 344 of the second ground electrode 34 may be in contact with the associated lateral surface electrodes 621, 622, 623 and 624 in the entire sides. That is, the entire external shape of the second ground electrode 34 viewed in the thickness direction D1 of the mounting board 3 may be in contact with the first ground electrode 6.

(4-2) Second Modification

Figure 10:
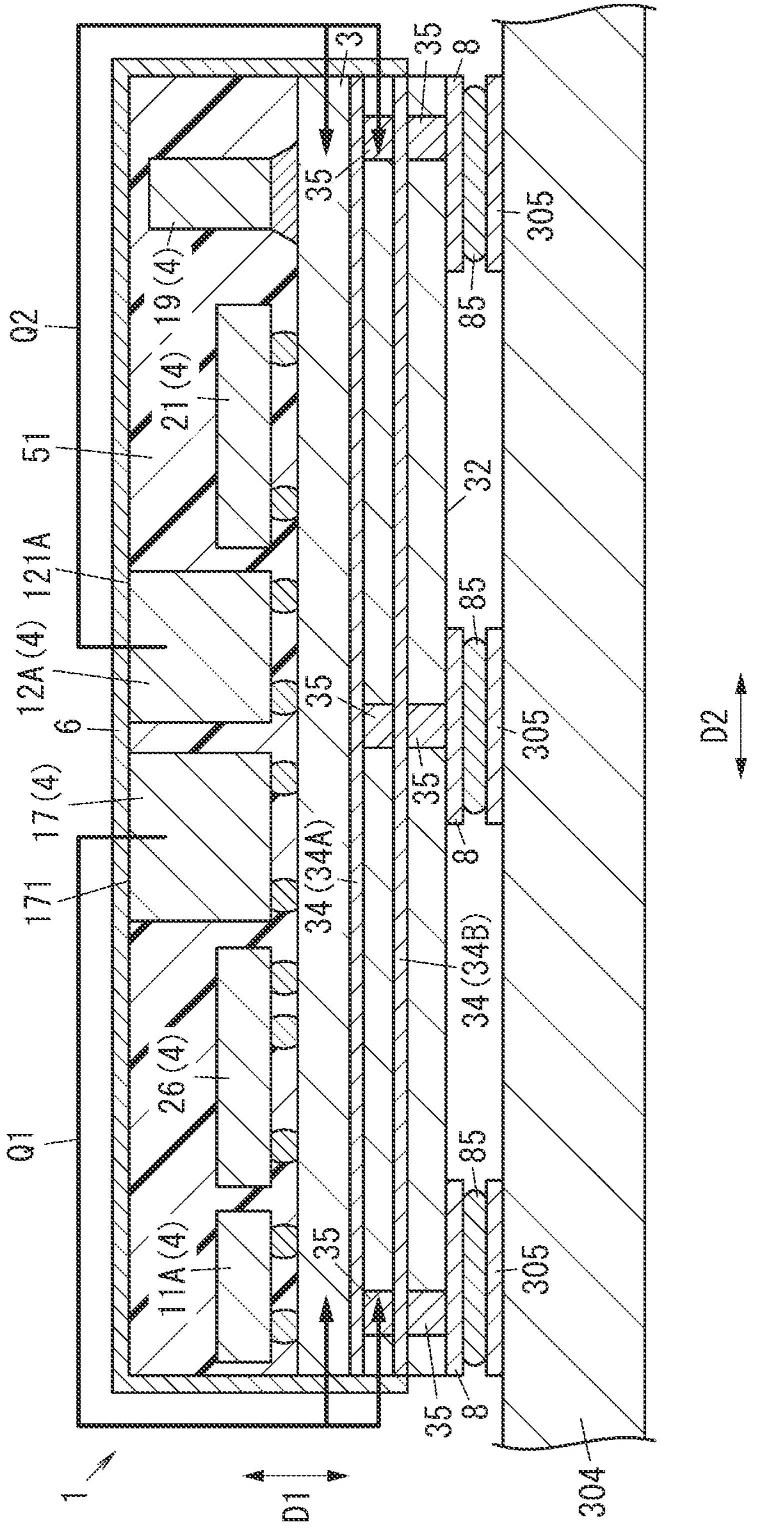
FIG. 10 is a cross-sectional view of a high-frequency module according to a second modification.

As illustrated in FIG. 10, a high-frequency module 1 according to a second modification includes a plurality of (two in the example of FIG. 10) second ground electrodes 34 in the embodiment described above. At least one (two (that is, all) in the example of FIG. 10) of the plurality of second ground electrodes 34 is connected to the first ground electrode 6.

More specifically, the plurality of (two in the example of FIG. 10) second ground electrodes 34 (34A, 34B) is provided away from each other in the thickness direction D1 of the mounting board 3 inside the mounting board 3. The second ground electrode 34B is disposed between the second ground electrode 34A and the second principal surface 32 of the mounting board 3. Each of the plurality of second ground electrodes 34 has, for example, a layer shape (film shape) parallel to the first principal surface 31 of the mounting board 3. The plurality of second ground electrodes 34 is connected to each other with the vias 35 interposed therebetween. Thus, the overall thermal capacity of the second ground electrodes 34 in the second modification increases compared with the embodiment described above (case of one second ground electrode 34). The second ground electrode 34B is connected to the external connection electrodes 8 with the vias 35 interposed therebetween. Both end portions of each of the plurality of second ground electrodes 34 in the second direction D2 are connected to the first ground electrode 6.

In the second modification, each of the heat Q1 and the heat Q2 generated by the transmission/reception filter 17 (first electronic component) and the transmission filter 12A (first electronic component) is dissipated by being transferred from each of the first principal surfaces 171 and 121A to the first ground electrode 6 and from the first ground electrode 6 to the plurality of second ground electrodes 34 in parallel. Thus, the heat Q1 and the heat Q2 can quickly be dissipated to the second ground electrodes 34. As a result, the heat dissipation performance for the transmission/reception filter 17 and the transmission filter 12A can further be improved.

The plurality of second ground electrodes 34 is connected to each other with the vias 35 interposed therebetween. Therefore, the overall thermal capacity of the second ground electrodes 34 in the second modification increases compared with the embodiment described above. Thus, the heat Q1 and the heat Q2 can be dissipated to the second ground electrodes 34 more quickly. As a result, the heat dissipation performance for the transmission/reception filter 17 and the transmission filter 12A can further be improved. Although all the plurality of second ground electrodes 34 in the second modification are provided inside the mounting board 3, it is only necessary that at least one of the plurality of second ground electrodes 34 be provided inside the mounting board 3. For example, in a case of two second ground electrodes 34, one second ground electrode 34 may be provided inside the mounting board 3 and the other one second ground electrode 34 may be provided on the surface of the mounting board 3 (one principal surface out of the principal surfaces on both sides).

(4-3) Third Modification

Figure 11:
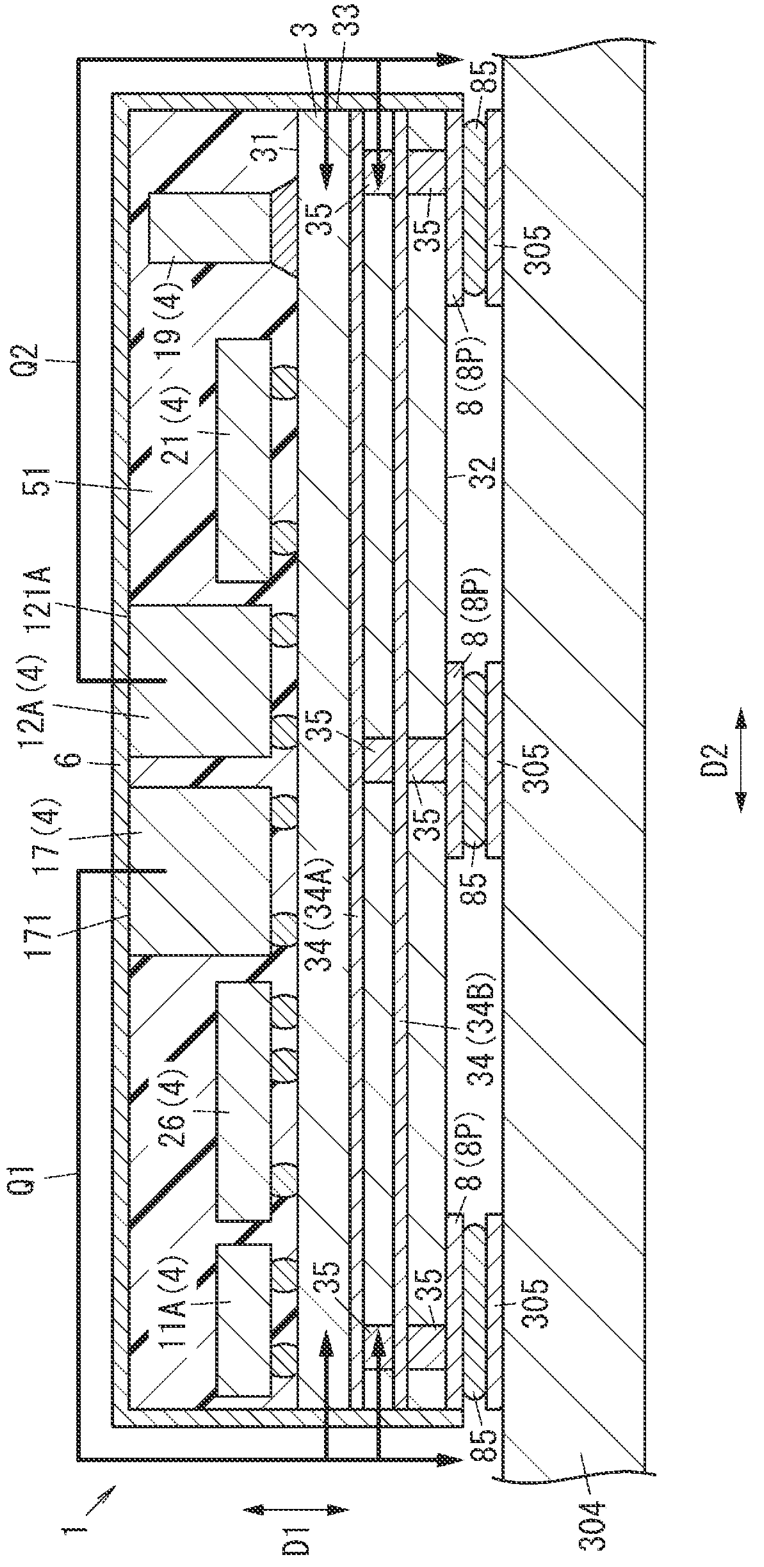
FIG. 11 is a cross-sectional view of a high-frequency module according to a third modification.

As illustrated in FIG. 11, in a high-frequency module 1 according to a third modification, the first ground electrode 6 is connected to the second ground electrodes 34 and further to the external connection electrodes 8P in the second modification.

More specifically, the first ground electrode 6 covers the entire outer peripheral surface 33 of the mounting board 3, and further covers the lateral surfaces of the external connection electrodes 8P disposed at both edge portions of the second principal surface 32 of the mounting board 3 in the second direction D2. The first ground electrode 6 is connected to the external connection electrodes 8P by covering the lateral surfaces of the external connection electrodes 8P.

In the third modification, the heat Q1 and the heat Q2 generated by the transmission/reception filter 17 (first electronic component) and the transmission filter 12A (first electronic component) are dissipated by being transferred from the first ground electrode 6 to at least one of the plurality of second ground electrodes 34 as with the second modification. In the third modification, the heat Q1 and the heat Q2 are dissipated by being transferred further from the first ground electrode 6 to the external connection electrodes 8P. Thus, the number of the heat dissipation paths for the heat Q1 and the heat Q2 in the third modification increases compared with the second modification. As a result, the heat dissipation performance for the transmission/reception filter 17 and the transmission filter 12A can further be improved.

(4-4) Fourth Modification

Figure 12:
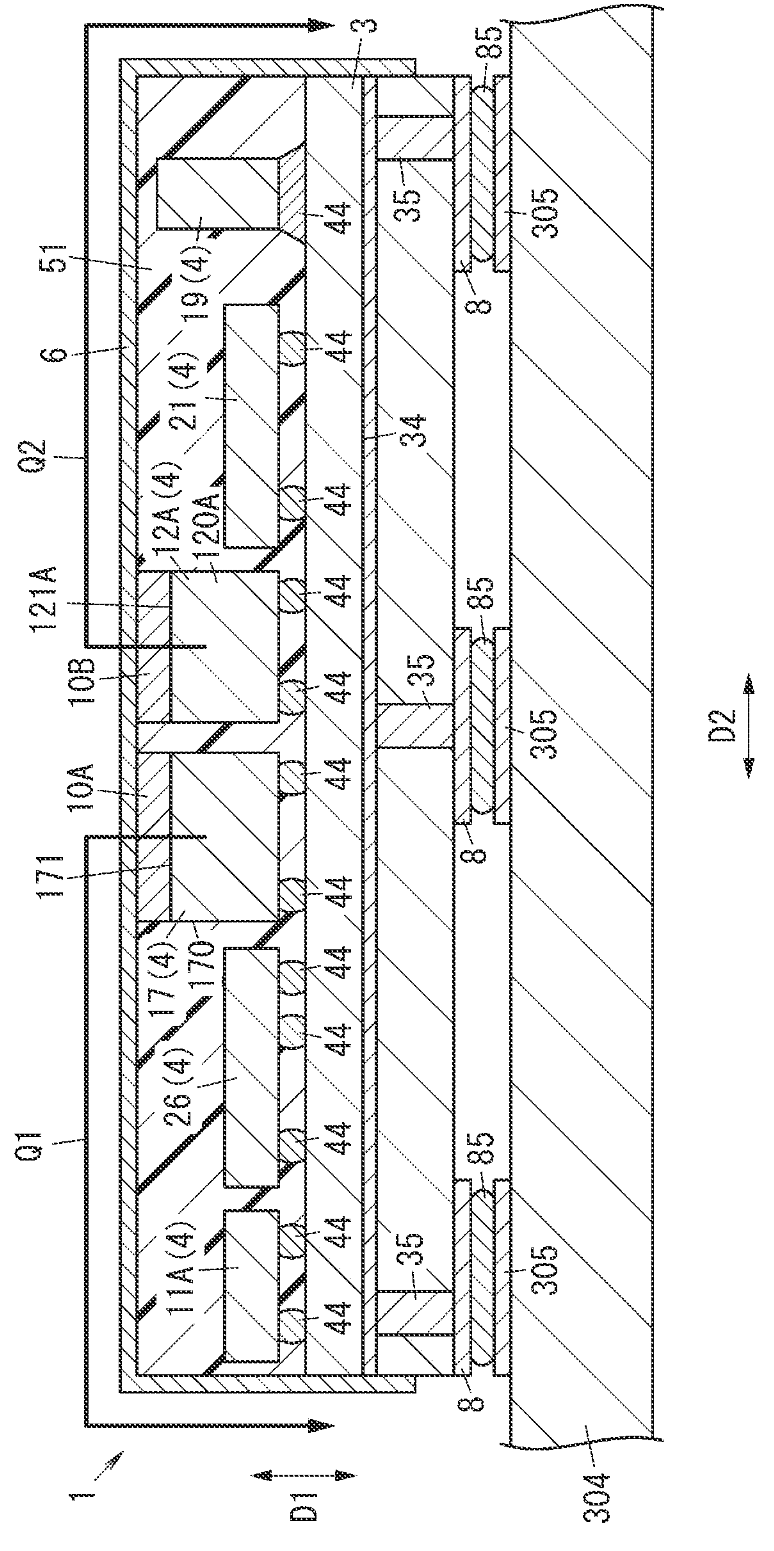
FIG. 12 is a cross-sectional view of a high-frequency module according to a fourth modification.

As illustrated in FIG. 12, a high-frequency module 1 according to a fourth modification further includes metal members 10A and 10B in the embodiment described above. The metal member 10A is disposed between the first principal surface 171 of the transmission/reception filter 17 (first electronic component) and the first ground electrode 6. For example, the metal member 10A has a flat-plate shape. The metal member 10A covers the entire first principal surface 171 of the transmission/reception filter 17. The metal member 10A is connected to both the first principal surface 171 of the transmission/reception filter 17 and the first ground electrode 6. That is, the first principal surface 171 of the transmission/reception filter 17 is connected to the first ground electrode 6 via the metal member 10A. The metal member 10B is disposed between the first principal surface 121A of the transmission filter 12A (first electronic component) and the first ground electrode 6. For example, the metal member 10B has a flat-plate shape. The metal member 10B covers the entire first principal surface 121A of the transmission filter 12A. The metal member 10B is connected to both the first principal surface 121A of the transmission filter 12A and the first ground electrode 6. That is, the first principal surface 121A of the transmission filter 12A is connected to the first ground electrode 6 via the metal member 10B. The metal members 10A and 10B may be made of the same material or different materials.

In the fourth modification, the heat Q1 and the heat Q2 generated by the transmission/reception filter 17 (first electronic component) and the transmission filter 12A (first electronic component) are transferred to the first ground electrode 6 via the metal members 10A and 10B, respectively. That is, with the metal members 10A and 10B, the heat Q1 and the heat Q2 can quickly be transferred from the transmission/reception filter 17 and the transmission filter 12A to the metal members 10A and 10B, respectively. Thus, the heat dissipation performance for the transmission/reception filter 17 and the transmission filter 12A can further be improved.

(4-5) Fifth Modification

Figure 13:
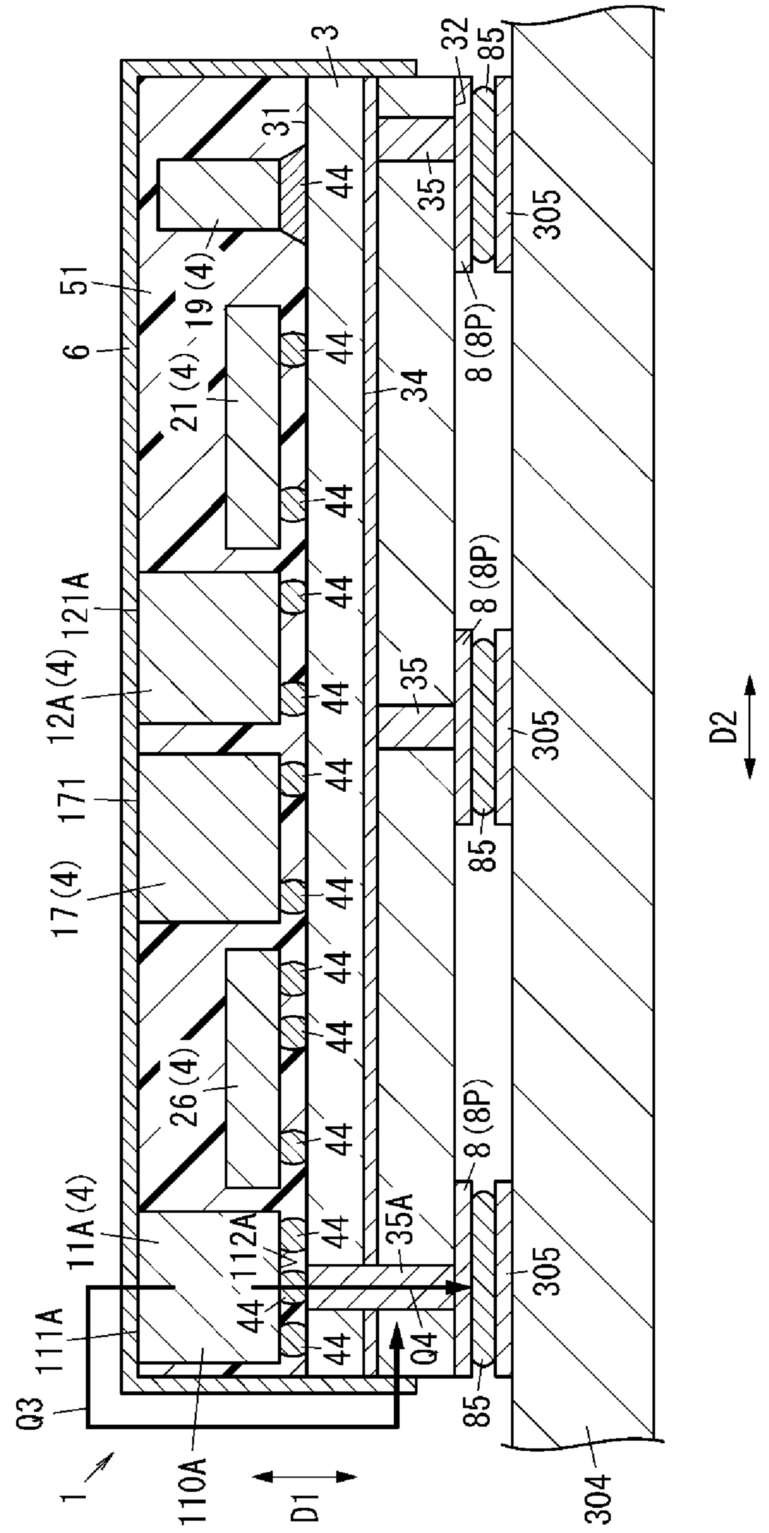
FIG. 13 is a cross-sectional view of a high-frequency module according to a fifth modification.

As illustrated in FIG. 13, in a high-frequency module 1 according to a fifth modification, a first principal surface 111A of the power amplifier 11A (first electronic component) is also connected to the first ground electrode 6 in the embodiment described above.

More specifically, the power amplifier 11A includes a substrate 110A, a circuit portion (not illustrated), and external terminals (not illustrated). For example, the substrate 110A has a flat-plate shape. The substrate 110A has the first principal surface 111A and a second principal surface 112A facing each other. The first principal surface 111A is a principal surface opposite to the mounting board 3 (referred to also as “top surface”). The second principal surface 112A is a principal surface on the mounting board 3 side (referred to also as “back surface”). For example, the substrate 110A is a gallium arsenide (GaAs) substrate. The circuit portion includes a circuit for amplifying the transmission signal. The circuit portion is disposed on the second principal surface 112A of the substrate 110A. The external terminal is a part connected to the pad electrode of the mounting board 3 described above via the connection member 44, and is disposed on the second principal surface 112A of the substrate 110A. The first principal surface 111A of the power amplifier 11A is exposed from the first resin layer 51 at the one principal surface 511 of the first resin layer 51, and is connected to the first ground electrode 6. That is, in the fifth modification, the first resin layer 51 covers at least a part of the first principal surface 111A of the power amplifier 11A (entire first principal surface 111A in the example of FIG. 13).

The mounting board 3 according to the fifth modification includes a through via 35A (thermal via). The through via 35A transfers the heat Q4 generated by the power amplifier 11A to the external connection electrode 8P. The through via 35A is disposed at a part directly below the power amplifier 11A inside the mounting board 3 (that is, a part overlapping the power amplifier 11A in the thickness direction D1 of the mounting board 3). The through via 35A passes through the mounting board 3 in the thickness direction D1. The upper end portion of the through via 35A is connected to the external terminal (not illustrated) of the power amplifier 11A via the connection member 44. The lower end portion of the through via 35A is connected to the external connection electrode 8P disposed on the second principal surface 32 of the mounting board 3. In the fifth modification, the through via 35A is connected to the second ground electrode 34, but need not be connected to the second ground electrode 34.

In the fifth modification, the partial heat Q3 generated by the power amplifier 11A (first electronic component) is dissipated by being transferred from the first principal surface 111A of the power amplifier 11A to the first ground electrode 6 and from the first ground electrode 6 to the second ground electrode 34. Thus, the heat dissipation performance for the power amplifier 11A is improved. The partial heat Q4 generated by the power amplifier 11A is dissipated by being transferred from the power amplifier 11A to the external connection electrode 8P through the connection member 44 and the through via 35A. Thus, the heat dissipation performance for the power amplifier 11A is further improved.

(4-6) Sixth Modification

Figure 14:
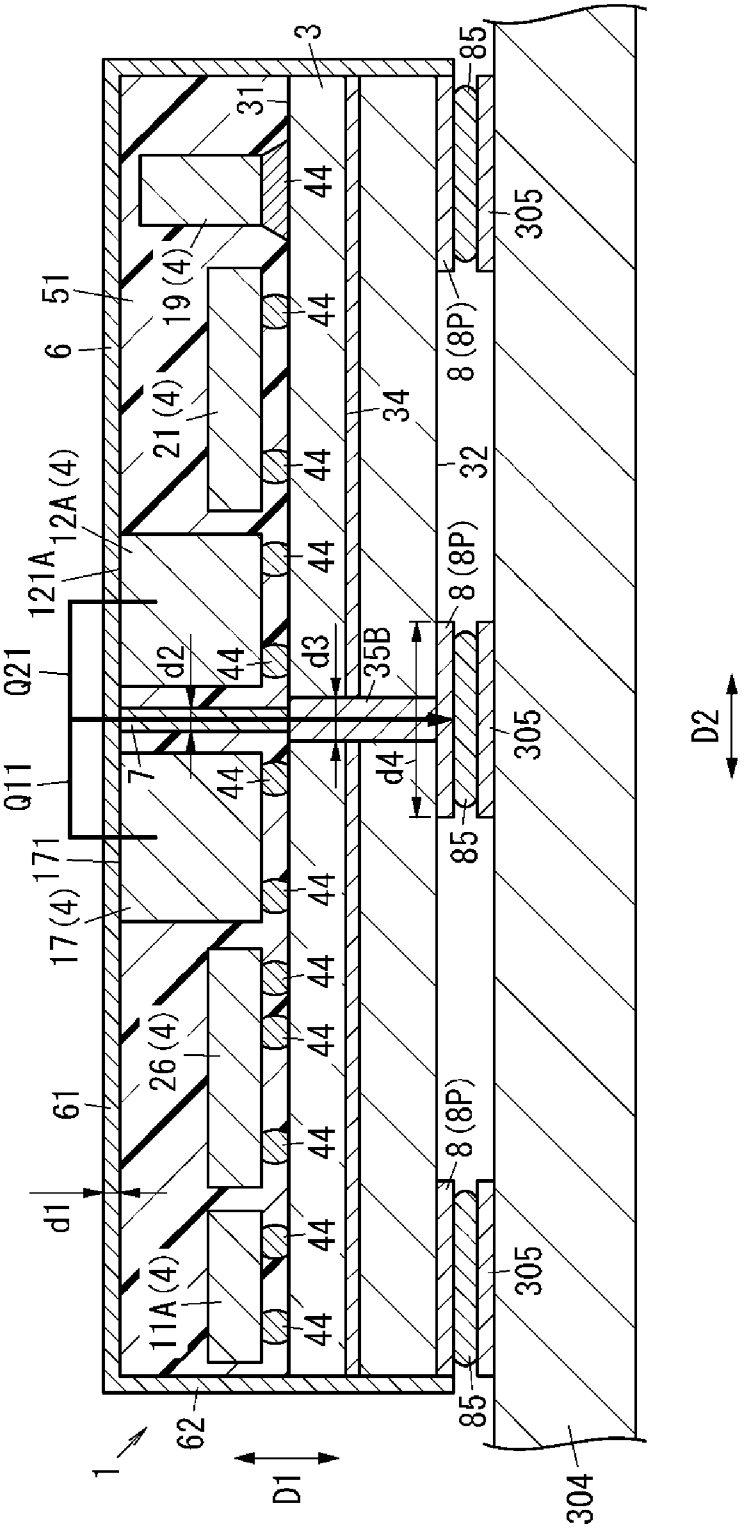
FIG. 14 is a cross-sectional view of a high-frequency module according to a sixth modification.

As illustrated in FIG. 14, a high-frequency module 1 according to a sixth modification further includes an electromagnetic shielding wall 7 (conductive member) and a through via 35B (thermal via) in the embodiment described above.

The electromagnetic shielding wall 7 is a conductive member that is disposed between the plurality of electronic components 4 on the first principal surface 31 of the mounting board 3 and achieves the electromagnetic shielding between the plurality of electronic components 4. The electromagnetic shielding wall 7 is a conductive member set at the ground potential. In the sixth modification, the electromagnetic shielding wall 7 is disposed between, for example, the transmission/reception filter 17 and the transmission filter 12A in plan view in the thickness direction D1 of the mounting board 3. The description "C (for example, the electromagnetic shielding wall 7) is disposed between A (for example, the transmission/reception filter 17) and B (for example, the transmission filter 12A) in plan view in the thickness direction D1 of the mounting board 3" herein means that at least one of a plurality of line segments each connecting an arbitrary point in A and an arbitrary point in B in plan view in the thickness direction D1 of the mounting board 3 passes through an area of C. The plan view in the thickness direction D1 of the mounting board 3 means that the electronic component disposed on the mounting board 3 is viewed by being orthographically projected to a plane parallel to the principal surface of the mounting board 3.

The electromagnetic shielding wall 7 is provided upright in the thickness direction D1 of the mounting board 3 from the first principal surface 31 of the mounting board 3. The end surface of the electromagnetic shielding wall 7 opposite to the mounting board 3 is connected to the first ground electrode 6.

The through via 35B connects the electromagnetic shielding wall 7 and the external connection electrode 8P. The through via 35B is disposed at a part directly below the electromagnetic shielding wall 7 inside the mounting board 3 (that is, a part overlapping the electromagnetic shielding wall 7 in the thickness direction D1 of the mounting board 3). The through via 35B passes through the mounting board in the thickness direction D1. The upper end portion of the through via 35B is connected to the based end surface of the electromagnetic shielding wall 7. The lower end portion of the through via 35B is connected to the external connection electrode 8P disposed on the second principal surface 32 of the mounting board 3. In the sixth modification, the through via 35B is connected to the second ground electrode 34, but need not be connected to the second ground electrode 34.

In the sixth modification, a thickness d1 of the first ground electrode 6 is, for example, 10 μm. A thickness d2 of the electromagnetic shielding wall 7 is, for example, 50 μm. A diameter d3 of the through via 35B is, for example, 10 μm or more and 50 μm or less. A width d4 of the external connection electrode is, for example, 200 μm or more and 1000 μm or less. As understood from those examples of numerical values, the thickness d2 of the electromagnetic shielding wall 7 is more than the thickness d1 of the first ground electrode 6. Therefore, the heat is efficiently transferred from the first ground electrode 6 to the electromagnetic shielding wall 7. The width d4 of the external connection electrode 8P is more than the diameter d3 of the through via 35B. Therefore, the heat is efficiently transferred from the through via 35B to the external connection electrode 8P.

In the sixth modification, a part of the heat generated by the transmission/reception filter 17 (first electronic component) and the transmission filter 12A (first electronic component) is dissipated to the second ground electrode 34 as with the heat Q1 and the heat Q2. Further, the heat Q11 and the heat Q21 that are parts of the heat generated by the transmission/reception filter 17 and the transmission filter 12A are transferred from the respective first principal surfaces 171 and 121A to the first ground electrode 6 and dissipated from the first ground electrode 6 to the external connection electrode 8P through the electromagnetic shielding wall 7 and the through via 35B. Thus, the number of the heat dissipation paths for the heat generated by the transmission/reception filter 17 and the transmission filter 12A can be increased. Accordingly, the heat dissipation performance for the transmission/reception filter 17 and the transmission filter 12A can further be improved.

In the sixth modification, the electromagnetic shielding wall 7 is disposed closer to the transmission/reception filter 17 and the transmission filter 12A than the lateral surface electrodes 62 of the first ground electrode 6. Therefore, the heat dissipation paths for the heat Q11 and the heat Q21 are shorter than the heat dissipation paths for the heat Q1 and the heat Q2. Thus, the majority of the heat generated by the transmission/reception filter 17 and the transmission filter 12A is dissipated through the heat dissipation paths for the heat Q11 and the heat Q21 rather than through the heat dissipation paths for the heat Q1 and the heat Q2. That is, the heat generated by the transmission/reception filter 17 and the transmission filter 12A is dissipated through the shorter heat dissipation paths. Accordingly, the heat dissipation performance for the transmission/reception filter 17 and the transmission filter 12A can still further be improved.

(4-7) Seventh Modification

Figure 15:
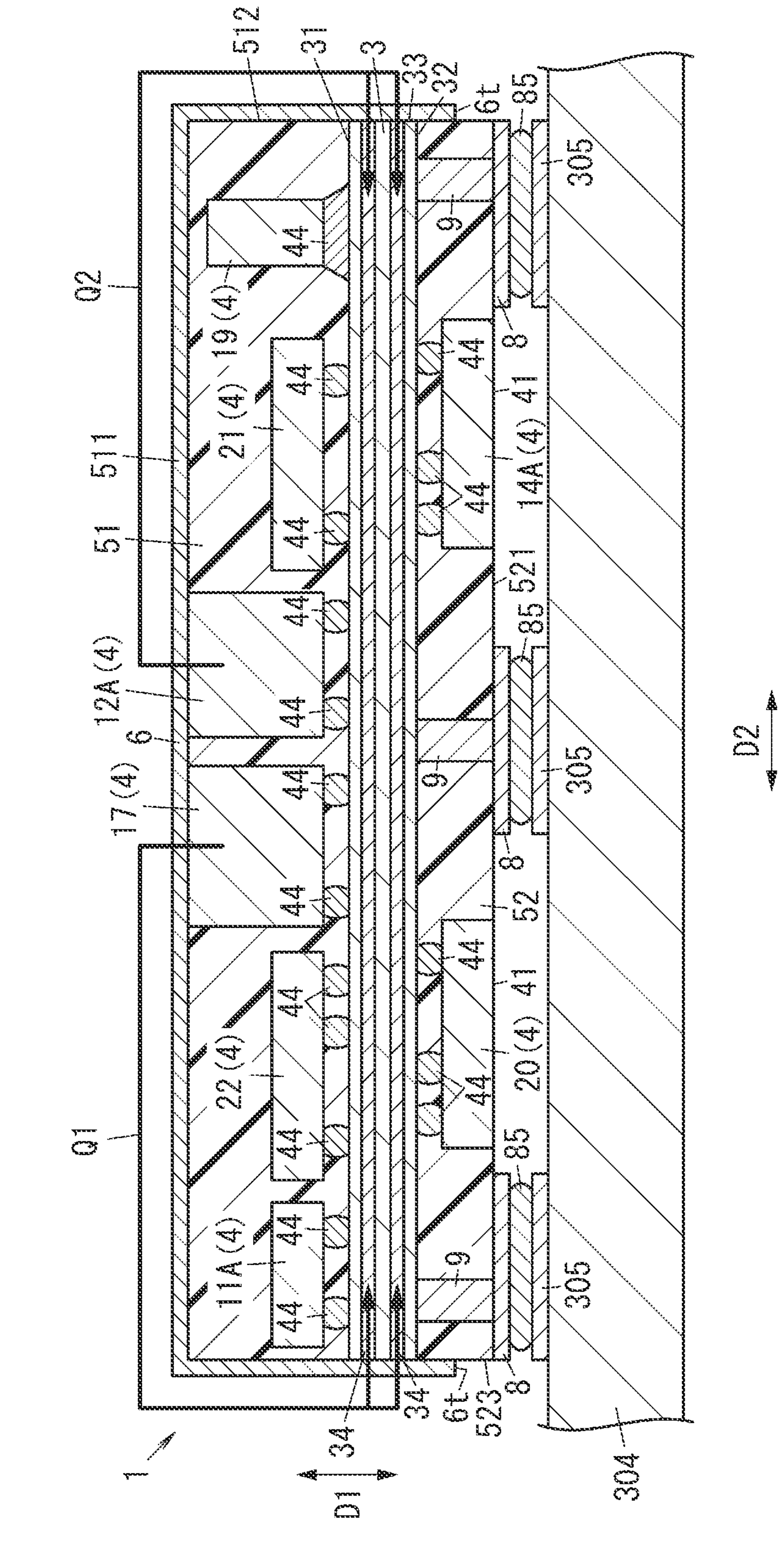
FIG. 15 is a cross-sectional view of a high-frequency module according to a seventh modification.

In the embodiment described above, the case where the high-frequency module 1 has the single-sided mounting structure (structure in which the electronic components are mounted only on one side of the mounting board 3) (see FIG. 3) is described as an example. In a seventh modification, a case where the high-frequency module 1 has a double-sided mounting structure (structure in which the electronic components are mounted on both sides of the electronic component 3) is described as an example as illustrated in FIG. 15. In the following description, the same constituent elements as those in the embodiment described above are represented by the same reference signs as those of the constituent elements in the embodiment described above and description thereof is omitted. Constituent elements different from those in the embodiment described above are mainly described.

In the seventh modification, the electronic components 4 are disposed on both the first principal surface 31 and the second principal surface 32 of the mounting board 3 as illustrated in FIG. 15. In the example of FIG. 15, the power amplifier 11A, the second switch 22, the transmission/reception filter 17 (first electronic component), the transmission filter 12A (first electronic component), the first switch 21, and the matching circuit 19 are disposed on the first principal surface 31 of the mounting board 3 with the connection members 44 interposed therebetween. The first principal surface 171 of the transmission/reception filter 17 and the first principal surface 121A of the transmission filter 12A are connected to the first ground electrode 6. The controller 20 (third electronic component) and the low-noise amplifier 14A (third electronic component) are disposed on the second principal surface 32 of the mounting board 3 with the connection members 44 interposed therebetween. The controller 20 and the second switch 22 are integrated as the IC chip 26, but are separately provided in the seventh modification.

In the seventh modification, the high-frequency module 1 further includes a plurality of connection terminals 9 and a second resin layer 52.

The plurality of connection terminals 9 is, for example, columnar conductive members each connecting a pad electrode (not illustrated) provided on the second principal surface 32 of the mounting board 3 and the external connection electrode 8.

The second resin layer 52 is provided on the second principal surface 32 of the mounting board 3. The second resin layer 52 covers at least a part of each of the plurality of electronic components 4 and the plurality of connection terminals 9 disposed on the second principal surface 32 of the mounting board 3. In the example of FIG. 15, the second resin layer 52 exposes one principal surface 41 of each of the plurality of electronic components 4 from one principal surface 521 of the second resin layer 52, and covers parts other than the one principal surface 41 of each electronic component 4. The one principal surface 41 of the electronic component 4 is a principal surface of the electronic component 4 opposite to the mounting board 3. The second resin layer 52 may cover the plurality of entire electronic components 4 disposed on the second principal surface 32 of the mounting board 3. The second resin layer 52 exposes the lower end surfaces of the plurality of connection terminals 9 from the one principal surface 521 of the second resin layer 52, and covers parts other than the lower end surfaces of the connection terminals 9. The lower end surface of the connection terminal 9 described above is an end surface opposite to the mounting board 3. The second resin layer 52 contains a resin. The second resin layer 52 may contain a filler in addition to the resin. The second resin layer 52 may be made of the same material as or a different material from that of the first resin layer 51.

In the seventh modification, the plurality of external connection electrodes 8 is disposed on the one principal surface 521 of the second resin layer 52 and connected to the lower end surfaces of the plurality of connection terminals 9 described above. The one principal surface 521 of the second resin layer 52 is a principal surface opposite to the mounting board 3.

In the seventh modification, the first ground electrode 6 covers the outer surfaces of the first resin layer 51 (one entire principal surface 511 and entire outer peripheral surface 512) and the entire outer peripheral surface 33 of the mounting board 3. Further, the first ground electrode 6 covers a part of an outer peripheral surface 523 of the second resin layer 52 (more specifically, a half or more area in the thickness direction D1 of the mounting board 3 from an upper side toward a lower side of the outer peripheral surface 523). The upper side of the outer peripheral surface 523 described above is a side of the outer peripheral surface 523 on the mounting board 3 side. The lower side of the outer peripheral surface 523 described above is a side of the outer peripheral surface 523 opposite to the mounting board 3. In other words, a lower end portion 6*t* of the first ground electrode 6 is disposed on the external connection electrode 8P side relative to the center of the second resin layer 52 in the thickness direction D1. The first ground electrode 6 is connected to both the end portions of the second ground electrode 34 in the second direction D2 on the outer peripheral surface 33 of the mounting board 3. The first ground electrode 6 is not in contact with the external connection electrodes 8.

In the seventh modification, the heat Q1 and the heat Q2 generated by the transmission/reception filter 17 (first electronic component) and the transmission filter 12A (first electronic component) are dissipated by being transferred from the respective first principal surfaces 171 and 121A to the first ground electrode 6 and from the first ground electrode 6 to the second ground electrode 34 as with the embodiment described above. Thus, the heat dissipation performance for the transmission/reception filter 17 and the transmission filter 12A is improved as with the embodiment described above.

In the seventh modification, the second ground electrode 34 is connected to the first ground electrode 6. Therefore, the electromagnetic shielding performance of the second ground electrode 34 is improved. Thus, a further electromagnetic shielding can be provided between the front and back of the mounting board 3 by the second ground electrode 34.

(4-8) Eighth Modification

Figure 16:
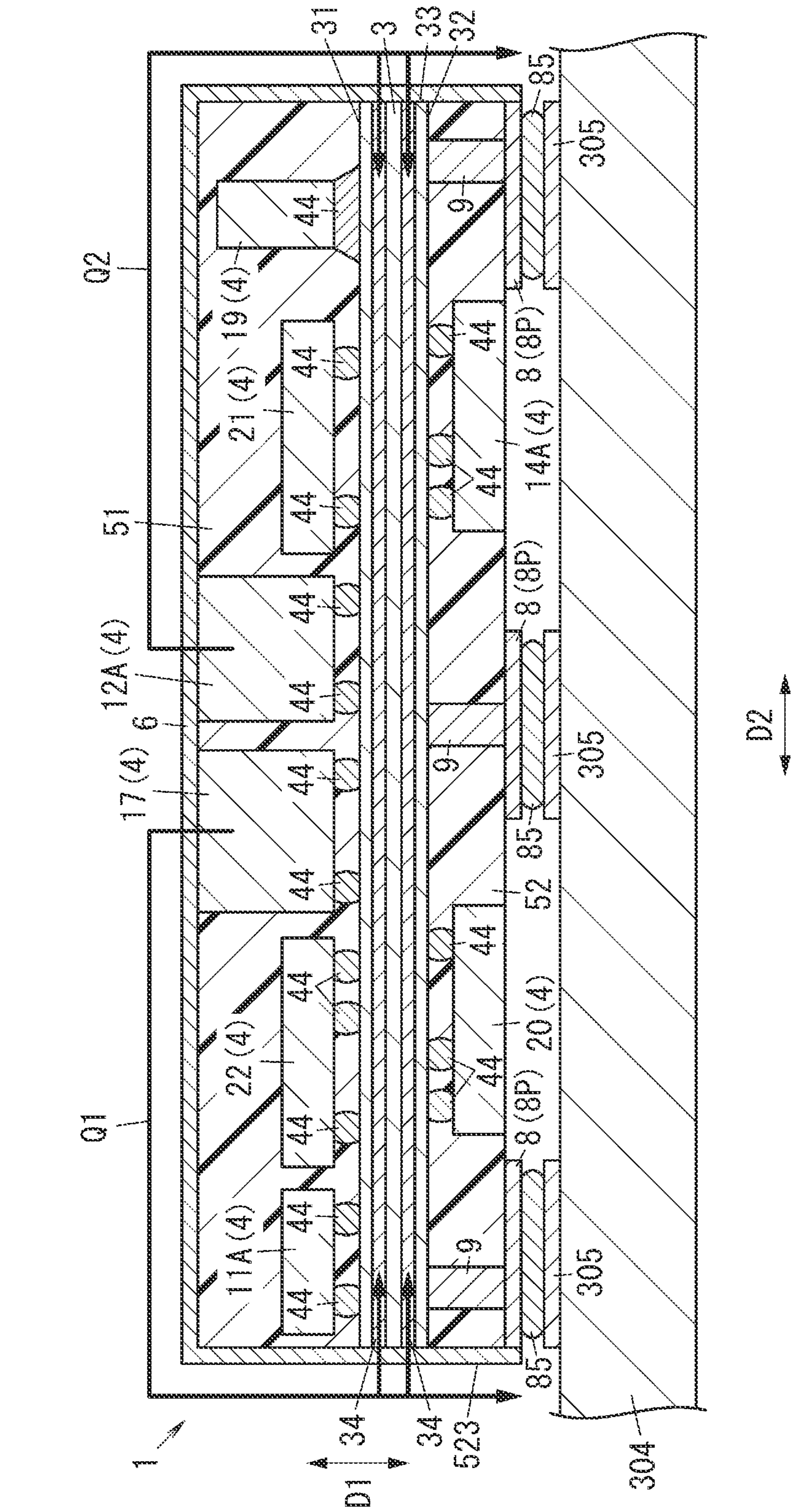
FIG. 16 is a cross-sectional view of a high-frequency module according to an eighth modification.

As illustrated in FIG. 16, in a high-frequency module 1 according to an eighth modification, the first ground electrode 6 is connected to the second ground electrode 34 and further to the external connection electrodes 8P in the seventh modification.

More specifically, the first ground electrode 6 covers the entire outer peripheral surface 523 of the second resin layer 52, and further covers the lateral surfaces of the external connection electrodes 8P disposed at both edge portions of the one principal surface 521 of the second resin layer 52 in the second direction D2 in the seventh modification. The first ground electrode 6 is connected to the external connection electrodes 8P by covering the lateral surfaces of the external connection electrodes 8P.

In the eighth modification, the heat Q1 and the heat Q2 generated by the transmission/reception filter 17 (first electronic component) and the transmission filter 12A (first electronic component) are dissipated by being transferred from the first ground electrode 6 to at least one of the plurality of second ground electrodes 34 as with the seventh modification. In the eighth modification, the heat Q1 and the heat Q2 are dissipated by being transferred further from the first ground electrode 6 to the external connection electrodes 8P. Thus, the number of the heat dissipation paths for the heat Q1 and the heat Q2 in the eighth modification increases compared with the seventh modification. As a result, the heat dissipation performance for the transmission/reception filter 17 and the transmission filter 12A can further be improved.

(5) Aspects

The following aspects are invented herein.

A high-frequency module (1) according to a first aspect includes a mounting board (3), a first electronic component (17, 12A; 11A), a first resin layer (51), and a first ground electrode (6). The mounting board (3) has a first principal surface (31) and a second principal surface (32) facing each other. The first electronic component (17, 12A; 11A) is disposed on the first principal surface (31) of the mounting board (3). The first resin layer (51) is disposed on the first principal surface (31) of the mounting board (3), and covers at least a part of an outer peripheral surface of the first electronic component (17, 12A; 11A). The first ground electrode (6) covers at least a part of the first resin layer (51). A principal surface (171, 121A; 111A) of the first electronic component (17, 12A; 11A) opposite to the mounting board (3) is connected to the first ground electrode (6). The mounting board (3) includes a second ground electrode (34) inside the mounting board (3). The first ground electrode (6) is connected to the second ground electrode (34).

In this structure, the principal surface (171, 121A; 111A) of the first electronic component (17, 12A; 11A) opposite to the mounting board (3) is connected to the first ground electrode (6), and the first ground electrode (6) is connected to the second ground electrode (34). Thus, the heat (Q1, Q2; Q3) generated by the first electronic component (17, 12A; 11A) can be dissipated to the second ground electrode (34) through the first ground electrode (6). As a result, the heat dissipation performance for the first electronic component (17, 12A; 11A) can be improved.

In the high-frequency module (1) according to a second aspect, in the first aspect, the first electronic component (17, 12A; 11A) is provided on a transmission path (T2, R2, T11; T1) along which a transmission signal passes.

In this structure, the first electronic component (17, 12A; 11A) is provided on the transmission path (T2, R2, T11; T1), and is therefore an electronic component of a transmission system. Thus, the heat dissipation performance for the electronic component of the transmission system can be improved.

In the high-frequency module (1) according to a third aspect, in the first or second aspect, the first electronic component (17, 12A; 11A) is a transmission filter (12A), a transmission/reception filter (17), or a power amplifier (11A).

In this structure, the heat dissipation performance for the transmission filter (12A), the transmission/reception filter (17), or the power amplifier (11A) can be improved.

In the high-frequency module (1) according to a fourth aspect, in any one of the first to third aspects, the first ground electrode (6) includes a plurality of lateral surface electrodes (62) disposed on an outer peripheral surface of the mounting board (3). When viewed in a thickness direction (D1) of the mounting board (3), an external shape of the second ground electrode (34) includes a plurality of sides (341 to 344) associated with the plurality of lateral surface electrodes (621 to 624). At least one side (for example, 341, 343) out of the plurality of sides (341 to 344) is in contact with the lateral surface electrode (621, 623) associated with the one side in a half or more part of the one side.

In this structure, when the side (341, 343) of the second ground electrode (34) is in contact with the lateral surface electrode (621, 623) of the first ground electrode (6), a sufficient contact area can be provided therebetween.

In the high-frequency module (1) according to a fifth aspect, in any one of the first to fourth aspects, when viewed in a thickness direction (D1) of the mounting board (3), an external shape of the second ground electrode (34) includes at least two sides (341, 343) facing each other. The second ground electrode (34) is in contact with the first ground electrode (6) on the two sides (341, 343).

In this structure, the heat dissipation performance for the heat dissipated from the first ground electrode (6) to the second ground electrode (34) can be improved.

In the high-frequency module (1) according to a sixth aspect, in any one of the first to fourth aspects, when viewed in a thickness direction (D1) of the mounting board (3), an entire external shape of the second ground electrode (34) is in contact with the first ground electrode (6).

In this structure, a sufficient contact area can be provided between the first ground electrode (6) and the second ground electrode (34).

In the high-frequency module (1) according to a seventh aspect, in any one of the first to sixth aspects, a plurality of the second ground electrodes (34) is provided to the mounting board (3) in a thickness direction (D1) of the mounting board (3). At least one of the plurality of the second ground electrodes (34A, 34B) is provided inside the mounting board (3). The plurality of the second ground electrodes (34) is connected to each other. The first ground electrode (6) is connected to at least one of the plurality of the second ground electrodes (34).

In this structure, the heat dissipation performance for the heat dissipated from the first ground electrode (6) to the second ground electrode (34) can be improved.

The high-frequency module (1) according to an eighth aspect, in any one of the first to seventh aspects, further includes a metal member (10A, 10B) disposed between the principal surface (171, 121A) of the first electronic component (17, 12A) opposite to the mounting board (3) and the first ground electrode (6). The principal surface (171, 121A) of the first electronic component (17, 12A) is connected to the first ground electrode (6) via the metal member (10A, 10B).

In this structure, the heat (Q1, Q2) generated by the first electronic component (17, 12A) can efficiently be transferred to the first ground electrode (6) by the metal member.

The high-frequency module (1) according to a ninth aspect, in any one of the first to eighth aspects, further includes an external connection electrode (8P) disposed on the second principal surface (32) of the mounting board (3). The first ground electrode (6) is connected to the external connection electrode (8P).

In this structure, the heat (Q1, Q2; Q3) generated by the first electronic component (17, 12A; 11A) can be dissipated also to the external connection electrode (8P) through the first ground electrode (6). Thus, the heat dissipation performance for the first electronic component (17, 12A; 11A) can further be improved.

The high-frequency module (1) according to a tenth aspect, in any one of the first to ninth aspects, further includes an external connection electrode (8P) and a thermal via (35A). The external connection electrode (8P) is disposed on the second principal surface (32) of the mounting board (3). The thermal via (35A) passes through the mounting board (3) in a thickness direction (D1) of the mounting board (3). The thermal via (35A) is connected to the first electronic component (11A) via a connection member (44) and to the external connection electrode (8P).

In this structure, the heat generated by the first electronic component (11A) can be dissipated to the second ground electrode (34) through the first ground electrode (6) and also to the external connection electrode (8P) through the thermal via (35A). As a result, the heat dissipation performance for the first electronic component (11A) can further be improved.

In the high-frequency module (1) according to an eleventh aspect, in the tenth aspect, the thermal via (35A) is connected to the second ground electrode (34).

In this structure, the heat generated by the first electronic component (11A) can be dissipated also to the second ground electrode (34) through the thermal via (35A). As a result, the heat dissipation performance for the first electronic component (11A) can further be improved.

The high-frequency module (1) according to a twelfth aspect, in any one of the first to ninth aspects, further includes a second electronic component (12A, 17), a conductive member (7), an external connection electrode (8P), and a thermal via (35B). The second electronic component (12A, 17) is disposed on the first principal surface (31) of the mounting board (3). The conductive member (7) is disposed between the first electronic component (17, 12A) and the second electronic component (12A, 17) on the first principal surface (31) of the mounting board (3), an end surface of the conductive member (7) opposite to the mounting board (3) is connected to the first ground electrode (6), and the conductive member (7) is set at a ground potential. The external connection electrode (8P) is disposed on the second principal surface (32) of the mounting board (3). The thermal via (35B) is provided inside the mounting board (3) and connects the electromagnetic shielding wall (7) and the external connection electrode (8P).

In this structure, the heat (Q11, Q21) generated by the first electronic component (17, 12A) can be dissipated also to the external connection electrode (8P) through the first ground electrode (6), the electromagnetic shielding wall (7), and the thermal via (35B). Thus, the heat dissipation performance for the first electronic component (17, 12A) can further be improved.

In the high-frequency module (1) according to a thirteenth aspect, in any one of the first to twelfth aspects, a third electronic component (20, 14A) is disposed on the second principal surface (32) of the mounting board (3). A second resin layer (52) is provided on the second principal surface (32) so as to cover at least a part of an outer surface of the third electronic component (20, 14A).

In this structure, the present disclosure can be applied to a case where the mounting board (3) has a double-sided mounting structure. Since the second ground electrode (34) is connected to the first ground electrode (6) as described in the first aspect, the electromagnetic shielding performance of the second ground electrode (34) is improved. Therefore, when the present disclosure is applied to the case where the mounting board (3) has the double-sided mounting structure, a sufficient electromagnetic shielding can be provided between the front and back of the mounting board (3) the second ground electrode (34).

In the high-frequency module (1) according to a fourteenth aspect, in the thirteenth aspect, the first ground electrode (6) covers a half or more area of an outer peripheral surface (523) of the second resin layer (52) in a thickness direction (D1) of the mounting board (3).

In this structure, the heat dissipation area of the first ground electrode (6) can be enlarged. Further, it is possible to reduce the occurrence of a case where an electromagnetic wave from the third electronic component (20, 14A) leaks to the outside from the outer peripheral surface (523) of the second resin layer (52).

The high-frequency module (1) according to a fifteenth aspect, in the fourteenth aspect, further includes an external connection electrode (8P) disposed on a principal surface (521) of the second resin layer (52) opposite to the mounting board (3). The first ground electrode (6) is connected to the external connection electrode (8P).

In this structure, in the case where the mounting board (3) has the double-sided mounting structure, the heat (Q1, Q2; Q3) generated by the first electronic component (17, 12A; 11A) can be dissipated to the second ground electrode (34) through the first ground electrode (6) and also to the external connection electrode (8P) through the first ground electrode (6). Thus, the heat dissipation performance for the first electronic component (17, 12A; 11A) can further be improved.

A communication device (300) according to a sixteenth aspect includes the high-frequency module (1) in any one of the first to fifteenth aspects and a signal processing circuit (301). The signal processing circuit (301) processes a high-frequency signal that passes through the high-frequency module (1).

In this structure, it is possible to provide the communication device (300) having the effects of the high-frequency module (1) described above.

1 high-frequency module
3 mounting board
4 electronic component
6 first ground electrode
6*t* lower end portion
7 electromagnetic shielding wall (conductive member)
8, 8P external connection electrode
9 connection terminal
10A, 10B metal member
11A power amplifier (first electronic component, second electronic component)
11B power amplifier
12A transmission filter (first electronic component, second electronic component)
12B transmission filter
13A, 13B output matching circuit

14A low-noise amplifier (second electronic component)
14B low-noise amplifier
15A, 15B reception filter
16A, 16B input matching circuit
17 transmission/reception filter (first electronic component, second electronic component)
18A-18C matching circuit
19 matching circuit
20 controller (third electronic component)
21 first switch
22 second switch
23 third switch
24 fourth switch
26 IC chip
31 first principal surface
32 second principal surface
33 outer peripheral surface
34, 34A, 34B second ground electrode
35 via
35A, 35B through via (thermal via)
37 dielectric layer
41 first principal surface
44 connection member
51 first resin layer
52 second resin layer
61 principal surface electrode
62 lateral surface electrode
81 antenna terminal
82A, 82B signal input terminal
83A, 83B signal output terminal
84 control terminal
85 connection member
110A, 120A, 170 substrate
111A, 121A, 171 first principal surface
112A, 122A, 172 second principal surface
210, 220, 230, 240 common terminal
211-213, 221, 222, 231, 232, 241, 242 selective terminal
300 communication device
301 signal processing circuit
302 RF signal processing circuit
303 baseband signal processing circuit
304 external board
305 external connection electrode
306 first principal surface
310 antenna
341-344 side
345-358 part
511, 521 one principal surface
512, 523 outer peripheral surface
621-624 lateral surface electrode
d3 diameter
d4 width
D1 first direction
D2 second direction
D3 third direction
Q1, Q2, Q3, Q4, Q11, Q21 heat
R1, R11, R12, R2 reception path
T1, T11, T12, T2 transmission path

The invention claimed is:

1. A high-frequency module comprising:
a mounting board having a first principal surface and a second principal surface facing each other;
a first electronic component disposed on the first principal surface of the mounting board;
a first resin layer disposed on the first principal surface of the mounting board and covering at least a part of an outer peripheral surface of the first electronic component; and
a first ground electrode covering at least a part of the first resin layer,
wherein a principal surface of the first electronic component opposite to the mounting board directly contacts the first ground electrode,
wherein the mounting board comprises at least one second ground electrode inside the mounting board, and
wherein the first ground electrode is connected to the second ground electrode.

2. The high-frequency module according to claim 1, wherein the first electronic component is provided on a transmission path along which a transmission signal passes.

3. The high-frequency module according to claim 2, wherein the first electronic component is a transmission filter, a transmission/reception filter, or a power amplifier.

4. The high-frequency module according to claim 2,
wherein the first ground electrode comprises a plurality of lateral surface electrodes disposed on an outer peripheral surface of the mounting board,
wherein, when viewed in a thickness direction of the mounting board, an external shape of the second ground electrode comprises a plurality of sides associated with the plurality of lateral surface electrodes, and
wherein at least one side out of the plurality of sides is in contact with at least one lateral surface electrode across half or more of the one side.

5. The high-frequency module according to claim 2,
wherein, when viewed in a thickness direction of the mounting board, an external shape of the second ground electrode comprises at least two sides facing each other, and
wherein the second ground electrode is in contact with the first ground electrode on the two sides.

6. The high-frequency module according to claim 1, wherein, when viewed in a thickness direction of the mounting board, an entire external shape of the second ground electrode is in contact with the first ground electrode.

7. The high-frequency module according to claim 1,
wherein the at least one second ground electrode comprises a plurality of second ground electrodes each provided to the mounting board in a thickness direction of the mounting board,
wherein at least one of the plurality of the second ground electrodes is provided inside the mounting board,
wherein the plurality of the second ground electrodes is connected to each other, and
wherein the first ground electrode is connected to at least one of the plurality of the second ground electrodes.

8. The high-frequency module according to claim 1,
wherein the first ground electrode comprises a plurality of lateral surface electrodes disposed on an outer peripheral surface of the mounting board,
wherein, when viewed in a thickness direction of the mounting board, an external shape of the second ground electrode comprises a plurality of sides associated with the plurality of lateral surface electrodes, and
wherein at least one side out of the plurality of sides is in contact with at least one lateral surface electrode across half or more of the one side.

9. The high-frequency module according to claim 1, further comprising an external connection electrode disposed on the second principal surface of the mounting board, wherein the first ground electrode is connected to the external connection electrode.

10. The high-frequency module according to claim 1, further comprising:

an external connection electrode disposed on the second principal surface of the mounting board; and a thermal via passing through the mounting board in a thickness direction of the mounting board, wherein the thermal via is connected to the first electronic component via a connection member and to the external connection electrode.

11. The high-frequency module according to claim 10, wherein the thermal via is connected to the second ground electrode.

12. The high-frequency module according to claim 1, further comprising:

a second electronic component disposed on the first principal surface of the mounting board;

a conductive member disposed between the first electronic component and the second electronic component on the first principal surface of the mounting board, an end surface of the conductive member opposite to the mounting board being connected to the first ground electrode, the conductive member being set at a ground potential;

an external connection electrode disposed on the second principal surface of the mounting board; and a thermal via provided inside the mounting board and connecting the conductive member and the external connection electrode.

13. The high-frequency module according to claim 1, further comprising:

a third electronic component disposed on the second principal surface of the mounting board; and a second resin layer provided on the second principal surface so as to cover at least a part of an outer surface of the third electronic component.

14. The high-frequency module according to claim 13, wherein the first ground electrode covers a half or more area of an outer peripheral surface of the second resin layer in a thickness direction of the mounting board.

15. The high-frequency module according to claim 14, further comprising an external connection electrode disposed on a principal surface of the second resin layer opposite to the mounting board, wherein the first ground electrode is connected to the external connection electrode.

16. A communication device comprising:

the high-frequency module according to claim 1; and a signal processing circuit configured to process a high-frequency signal passing through the high-frequency module.

17. The high-frequency module according to claim 1, wherein, when viewed in a thickness direction of the mounting board, an external shape of the second ground electrode comprises at least two sides facing each other, and wherein the second ground electrode is in contact with the first ground electrode on the two sides.

18. The high-frequency module according to claim 1, wherein the first electronic component is a transmission filter, a transmission/reception filter, or a power amplifier.

19. The high-frequency module according to claim 18, wherein the first ground electrode comprises a plurality of lateral surface electrodes disposed on an outer peripheral surface of the mounting board, wherein, when viewed in a thickness direction of the mounting board, an external shape of the second ground electrode comprises a plurality of sides associated with the plurality of lateral surface electrodes, and wherein at least one side out of the plurality of sides is in contact with at least one lateral surface electrode across half or more of the one side.

* * * * *